(12) United States Patent
Kishiwada et al.

(10) Patent No.: US 11,848,137 B2
(45) Date of Patent: Dec. 19, 2023

(54) POWER CONVERSION DEVICE

(71) Applicant: Mitsubishi Electric Corporation, Tokyo (JP)

(72) Inventors: Yu Kishiwada, Tokyo (JP); Koji Nakajima, Tokyo (JP); Kenichi Tamura, Tokyo (JP); Taro Kimura, Tokyo (JP); Yoshikazu Nozuki, Tokyo (JP); Masaya Nonomura, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 592 days.

(21) Appl. No.: 17/051,612

(22) PCT Filed: Jun. 3, 2019

(86) PCT No.: PCT/JP2019/022005
§ 371 (c)(1),
(2) Date: Oct. 29, 2020

(87) PCT Pub. No.: WO2019/235430
PCT Pub. Date: Dec. 12, 2019

(65) Prior Publication Data
US 2021/0233695 A1    Jul. 29, 2021

(30) Foreign Application Priority Data
Jun. 5, 2018  (JP) ................. 2018-107988

(51) Int. Cl.
*H01F 27/22* (2006.01)
*H01F 27/06* (2006.01)
(Continued)

(52) U.S. Cl.
CPC ........... *H01F 27/22* (2013.01); *H01F 27/025* (2013.01); *H01F 27/06* (2013.01); *H01F 30/10* (2013.01);
(Continued)

(58) Field of Classification Search
CPC ........ H01F 27/22; H01F 27/025; H01F 27/06; H01F 30/10; H01F 27/085;
(Continued)

(56) References Cited

U.S. PATENT DOCUMENTS 9,024,715 B2 *  5/2015  Nishikawa ............ H01F 27/008
                                                      336/212
9,371,974 B2 *  6/2016  Nishikawa .............. F21S 43/00
(Continued)

FOREIGN PATENT DOCUMENTS

JP        S5396651 U      8/1978
JP        2001110655 A    4/2001
(Continued)

OTHER PUBLICATIONS

International Search Report (PCT/ISA/210), with translation, and Written Opinion (PCT/ISA/237) dated Aug. 20, 2019, by the Japan Patent Office as the International Searching Authority for International Application No. PCT/JP2019/022005.
(Continued)

*Primary Examiner* — Tuyen T Nguyen
(74) *Attorney, Agent, or Firm* — BUCHANAN INGERSOLL & ROONEY PC

(57) ABSTRACT

Provided is a power conversion device, including: a casing having a recessed portion; a magnetic component accommodated in the recessed portion of the casing; a heat radiation plate, which covers an opening of the recessed portion of the casing, and is thermally coupled to the magnetic component; and a fixing band wound around the magnetic component and the heat radiation plate to fix the magnetic component to the heat radiation plate, wherein at least a part of the fixing band is accommodated in a band accommodating groove formed in the recessed portion of the casing. With this configuration, assembly dimensional tol-
(Continued)

erance caused between the magnetic component and the heat radiation plate can be eliminated and it is therefore possible to maintain high output and achieve downsizing.

20 Claims, 22 Drawing Sheets

(51) Int. Cl.
| | |
|---|---|
| *H02M 1/32* | (2007.01) |
| *H01F 27/02* | (2006.01) |
| *H01F 30/10* | (2006.01) |
| *H02M 3/335* | (2006.01) |
| *H05K 7/20* | (2006.01) |

(52) U.S. Cl.
CPC ....... *H02M 1/327* (2021.05); *H02M 3/33576* (2013.01); *H05K 7/2039* (2013.01)

(58) Field of Classification Search
CPC .............. H01F 27/2804; H02M 1/327; H02M 3/33576; H02M 3/33569; H02M 3/003; H05K 7/2039; H05K 7/209
See application file for complete search history.

(56) References Cited

U.S. PATENT DOCUMENTS

| | | |
|---|---|---|
| 2003/0161111 A1 | 8/2003 | Yoshida et al. |
| 2010/0164670 A1 | 7/2010 | Nakahori et al. |
| 2018/0332731 A1 | 11/2018 | Kita |

FOREIGN PATENT DOCUMENTS

| | | | |
|---|---|---|---|
| JP | 2002208521 A | * | 7/2002 |
| JP | 3611548 B2 | | 1/2005 |
| JP | 2010003926 A | | 1/2010 |
| JP | 5120245 B2 | | 1/2013 |
| JP | 2017093145 A | | 5/2017 |
| JP | 6402942 B2 | | 10/2018 |

OTHER PUBLICATIONS

Office Action dated Apr. 6, 2021, issued in corresponding Japanese Patent Application No. 2020523095, 7 pages including 4 pages of English translation.

* cited by examiner

POWER CONVERSION DEVICE

TECHNICAL FIELD

The present invention relates to a power conversion device including a magnetic component.

BACKGROUND ART

A magnetic component to be used in a power conversion device generates heat during use, and is thus required to be cooled. In order to cool the magnetic component, as illustrated in FIG. 1(C) and FIG. 1(D) of Patent Literature 1, the magnetic component is brought into contact with a heat radiation plate. In this manner, the heat of the magnetic component transfers to the heat radiation plate so that the magnetic component is cooled. Further, in Patent Literature 2, a magnetic component is provided so as to be sandwiched between a casing and a heat radiation plate.

CITATION LIST

Patent Literature

[PTL 1] JP 3611548 B2
[PTL 2] JP 2017-093145 A

SUMMARY OF INVENTION

Technical Problem

However, there has been a fear in that, when the magnetic component is brought into contact with the heat radiation plate to be cooled as described in Patent Literatures 1 and 2, due to assembly dimensional tolerance at the time of manufacture, adhesion between the magnetic component and the heat radiation plate is deteriorated. Therefore, there have been problems in that a thermal resistance between the magnetic component and the heat radiation plate is increased to decrease heat radiation performance, and thus output of the power conversion device is decreased. Further, there has also been a problem in that, in order to eliminate the assembly dimensional tolerance of the power conversion device to improve the heat radiation performance, the magnetic component itself is required to be increased in size, or the heat radiation plate or the casing of the power conversion device is required to be increased in size.

The present invention has been made to solve the above-mentioned problems, and has an object to provide a power conversion device capable of maintaining high output and also achieving downsizing.

Solution to Problem

In order to solve the above-mentioned problems, according to one embodiment of the present invention, there is provided a power conversion device, including: a casing having a recessed portion; a magnetic component accommodated in the recessed portion of the casing; a heat radiation plate, which covers an opening of the recessed portion of the casing, and is thermally coupled to the magnetic component; and a fixing band wound around the magnetic component and the heat radiation plate to fix the magnetic component to the heat radiation plate, wherein, in the recessed portion of the casing, at least a part of the fixing band is accommodated in a band accommodating groove formed in the recessed portion of the casing.

Advantageous Effects of Invention

According to the power conversion device of the present invention, the assembly dimensional tolerance caused between the magnetic component and the heat radiation plate can be eliminated. Therefore, it is possible to maintain high output and achieve downsizing.

DESCRIPTION OF EMBODIMENTS

Embodiments of the present invention are described below with reference to the accompanying drawings.

Figure 1:
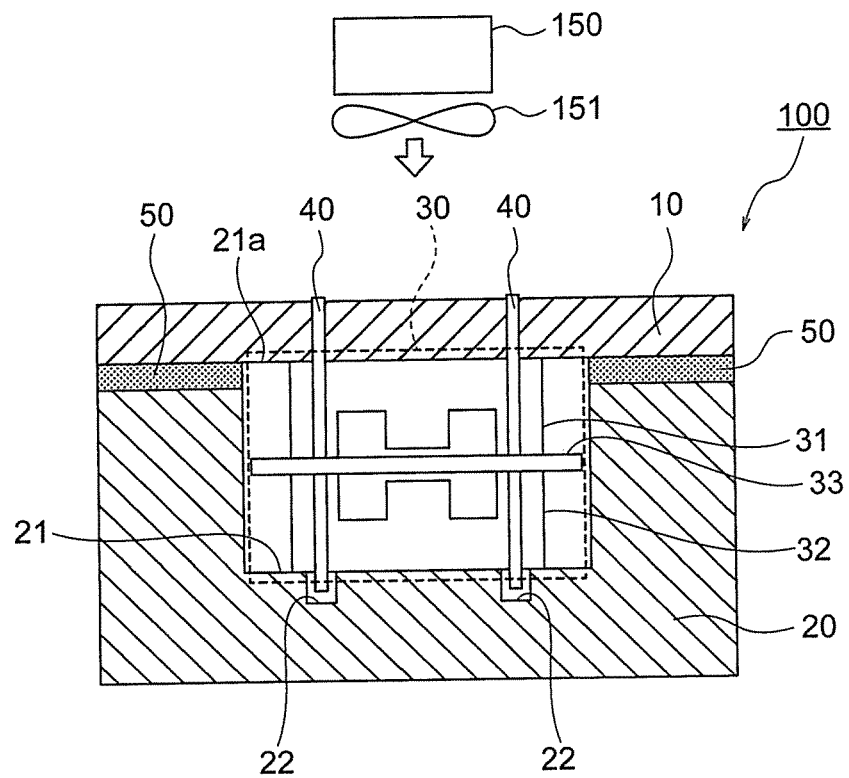
FIG. 1 is a view for schematically illustrating the structure of a power conversion device according to a first embodiment of the present invention.

As illustrated in FIG. 1, a power conversion device 100 includes a casing 20 and a heat radiation plate 10. The casing 20 has a recessed portion 21 formed therein. The heat radiation plate 10 is provided so as to cover an opening 21a of the recessed portion 21. Further, a magnetic component 30 is provided in the recessed portion 21 of the casing 20. The magnetic component 30 is fixed to the heat radiation plate 10 by two fixing bands 40. Further, a first heat-conducting material 50 formed of a resin is provided between the heat radiation plate 10 and the casing 20. It is preferred that a heat conductivity of the resin forming the first heat-conducting material 50 be equal to or more than 0.02 [W/m·K], which corresponds to a heat conductivity of air. For example, the first heat-conducting material 50 is an epoxy-based resin having a heat conductivity of 0.3 [W/m·K] or a silicon-based resin having a heat conductivity of 0.15 [W/m·K]. Further, in the recessed portion 21 of the casing 20, band accommodating grooves 22 are formed at positions corresponding to the fixing bands 40. Each of the band accommodating grooves 22 has a depth larger than the thickness of the fixing band 40. A part of the fixing band 40 protruding downward from the magnetic component 30 is accommodated in the band accommodating groove 22. Further, a cooling device 150 is provided on an outer side of the power conversion device 100. The cooling device 150 includes a fan 151 configured to send air to the power conversion device 100. The cooling device 150 is not limited to a device employing an air-cooling system, and may be a device employing a water-cooling system. Further, in FIG. 1, the cooling device 150 is arranged so as to effectively cool the heat radiation plate 10 of the power conversion device 100, but the position of the cooling device 150 is not particularly limited thereto. The cooling device 150 can be freely arranged at a portion of the power conversion device 100 that is desired to be cooled.

The heat radiation plate 10 is made of aluminum, and has a heat conductivity of 240 [W/m·K]. The material of the heat radiation plate 10 is not limited to aluminum, and may be other metals having high heat conductivities. For example, the heat radiation plate 10 may be made of copper having a heat conductivity of 400 [W/m·K]. Further, in order to obtain a higher heat radiation effect, the heat radiation plate 10 may be a heat sink including heat radiation fins (not shown).

Further, the fixing band 40 is made of polypropylene or a nylon-based or fluorine-based resin. The fixing band 40 may be a metal band.

Figure 2:
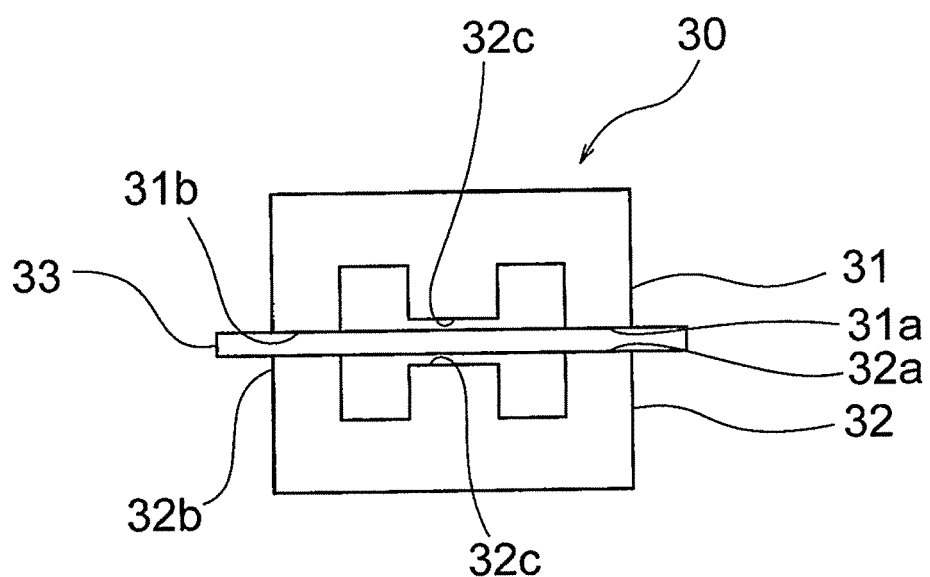
FIG. 2 is a side view for illustrating a magnetic component of the power conversion device illustrated in FIG. 1.

As illustrated in FIG. 2, the magnetic component 30 includes an upper core 31 and a lower core 32. The lower core 32 is provided so as to be opposed to the upper core 31. A winding portion 33 is provided between the upper core 31 and the lower core 32. Each of the upper core 31 and the lower core 32 is formed of, for example, a silicon steel plate, permalloy, or ferrite. A saturation magnetic flux density and a core loss vary depending on the type of the material of each of the upper core 31 and the lower core 32, and hence the material can be used selectively depending on the specification of the magnetic component 30. Further, in general, copper is used as the material of the winding portion 33, but aluminum is used in some cases. In general, the shape of the winding portion 33 is a round wire or a rectangular wire in many cases. Further, as the shape of the winding portion 33, a pattern of a printed board is used in some cases. As illustrated in FIG. 1, under a state in which the magnetic component 30 is accommodated in the recessed portion 21 of the casing 20, the upper core 31 of the magnetic component 30 is thermally coupled to the heat radiation plate 10, and the lower core 32 is thermally coupled to the casing 20.

Thermal coupling refers to direct contact of the upper core 31 or the lower core 32 to the heat radiation plate 10 or the casing 20, or coupling of the upper core 31 or the lower core 32 to the heat radiation plate 10 or the casing 20 through intermediation of a member having high heat conductivity. The member to be provided between the upper core 31 and the heat radiation plate 10 or between the lower core 32 and the casing 20 is formed of, for example, a sheet, compound, or grease having high heat conductivity. Further, when the upper core 31 or the lower core 32 is thermally coupled to the heat radiation plate 10 or the casing 20 directly without interposing a member, it is required to define a certain flatness on surfaces of the members to be brought into direct contact with each other in consideration of preventing an increase in thermal resistance.

Figure 3:
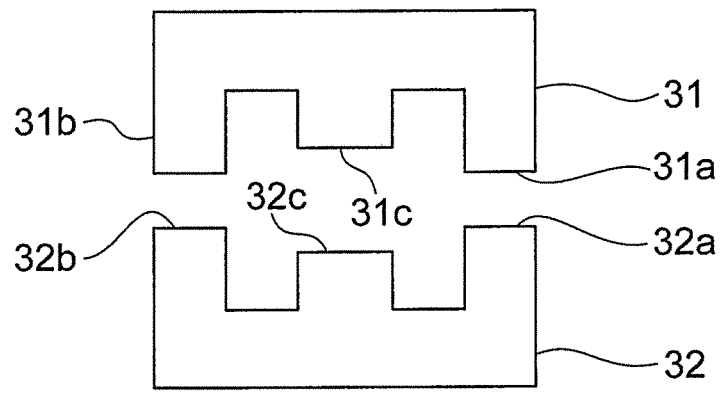
FIG. 3 is a side view for illustrating shapes of an upper core and a lower core of the magnetic component of the power conversion device illustrated in FIG. 1.

As illustrated in FIG. 2 and FIG. 3, each of the upper core 31 and the lower core 32 has a side surface formed into an E-shape. Specifically, the upper core 31 includes three protruding portions 31a to 31c, and the protruding portion 31b arranged at the middle of the upper core 31 has a length shorter than those of the pair of protruding portions 31a and 31c provided at both side portions. Similarly, the lower core 32 opposed to the upper core 31 includes three protruding portions 32a to 32c, and the protruding portion 32b arranged at the middle of the lower core 32 has a length shorter than those of the pair of protruding portions 32a and 32c provided at both side portions. Therefore, as illustrated in FIG. 2, the winding portion 33 is brought into a state in which the winding portion 33 is sandwiched between the protruding portions 31a and 31c of the upper core 31 and the protruding portions 32a and 32c of the lower core 32, and is not brought into contact with the middle protruding portion 31*b* of the upper core 31 and the middle protruding portion 32*b* of the lower core 32.

Figure 4A:
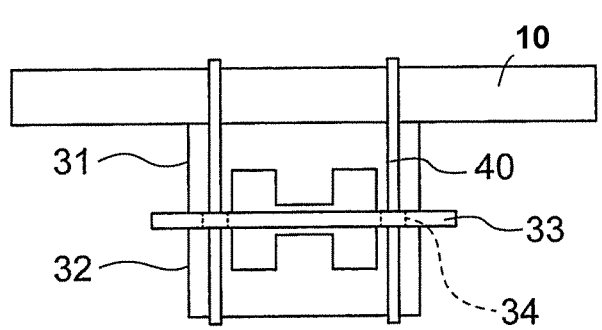
FIG. 4A is a view for illustrating assembly of the magnetic component and a heat radiation plate of the power conversion device illustrated in FIG. 1 and is a side view for illustrating the magnetic component and the heat radiation plate.
Figure 4B:
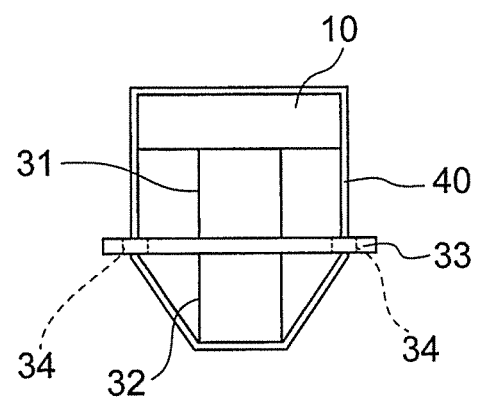
FIG. 4B is a view for illustrating assembly of the magnetic component and a heat radiation plate of the power conversion device illustrated in FIG. 1, and is a front view for illustrating the magnetic component and the heat radiation plate.
Figure 4C:
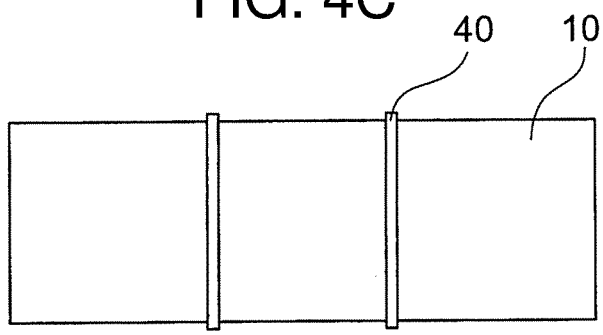
FIG. 4C is a view for illustrating assembly of the magnetic component and a heat radiation plate of the power conversion device illustrated in FIG. 1, and is a top view for illustrating the magnetic component and the heat radiation plate.

Further, as illustrated in FIG. 4A to FIG. 4C, the heat radiation plate 10 and the magnetic component 30 are fixed to each other by the fixing bands 40 externally wound therearound. The fixing bands 40 are inserted through band mounting holes 34 formed in the winding portion 33. The fixing bands 40 are wound around the heat radiation plate 10 and the magnetic component 30 so that the heat radiation plate 10 and the upper core 31 of the magnetic component 30 are brought into close contact with each other. Further, the heat radiation plate 10 and the magnetic component 30 are fixed to each other through use of the fixing bands 40 so that, for example, as compared to fixing through use of screws or fixing through use of adhesive materials, the assembly of the magnetic component 30 can be easily performed, and thus the assembly time can be reduced.

Figure 5:
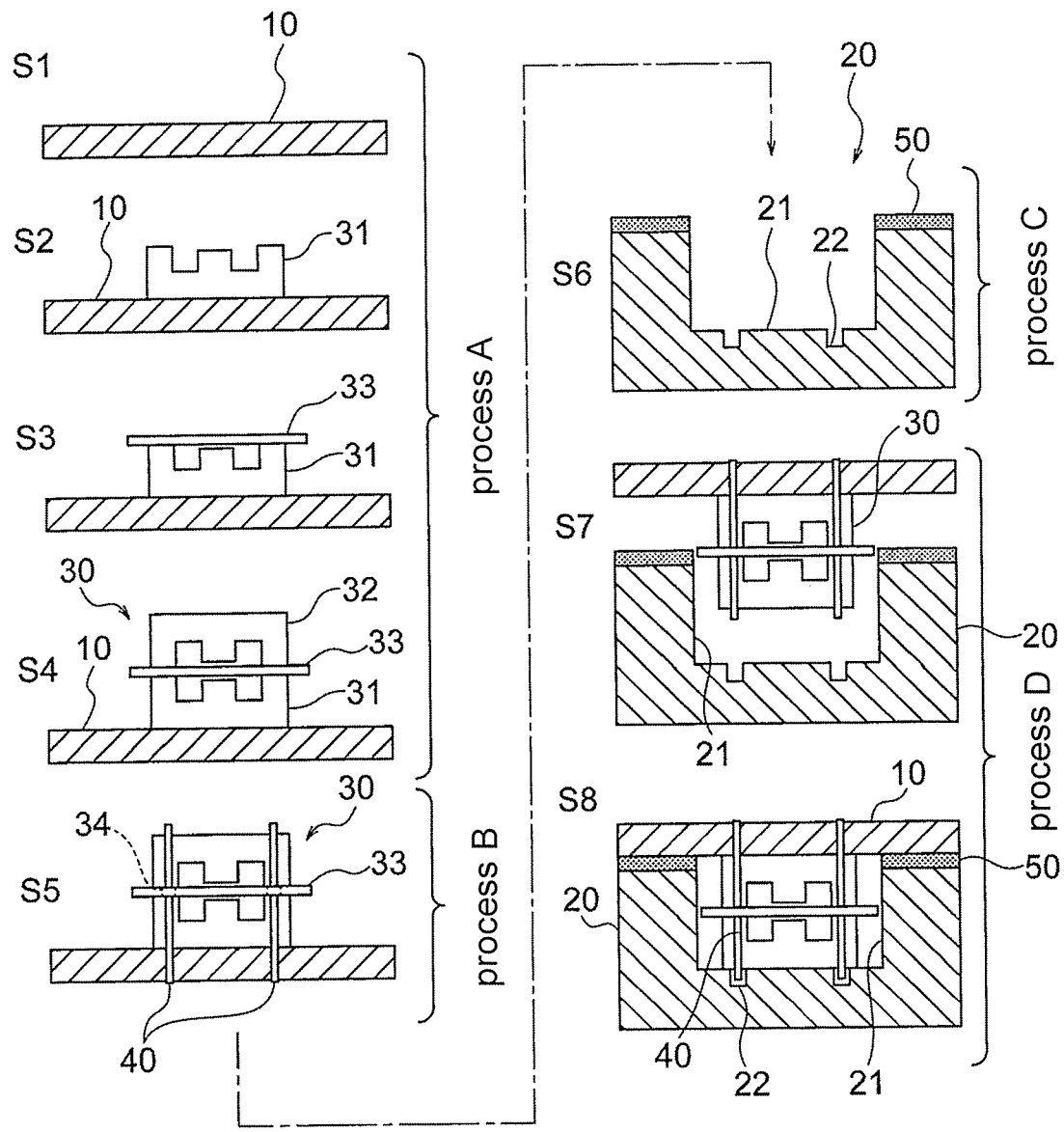
FIG. 5 is a view for illustrating a process of assembling the power conversion device illustrated in FIG. 1.

Next, with reference to FIG. 5, description is given of a method of assembling the power conversion device 100. In the following description, a process A is a process of assembling the magnetic component 30 on the heat radiation plate 10. A process B is a process of fixing, through use of the fixing bands 40, the heat radiation plate 10 and the magnetic component 30 assembled in the process A. A process C is a process of applying the first heat-conducting material 50 to a connection portion of the casing 20 to be connected to the heat radiation plate 10. A process D is a process of accommodating the magnetic component 30 assembled in the process B into the recessed portion 21 of the casing 20.

First, in the process A, the heat radiation plate 10 is prepared (Step S1), and the upper core 31 is placed on the heat radiation plate 10 (Step S2). Next, the winding portion 33 is placed on the protruding portions 31*a* and 31*c* of the upper core 31 (Step S3). Then, the lower core 32 is placed on the winding portion 33 so that the winding portion 33 is sandwiched between the protruding portions 31*a* and 31*c* of the upper core 31 and the protruding portions 32*a* and 32*c* of the lower core 32 (Step S4).

In the process B, the fixing bands 40 are inserted through the band mounting holes 34 of the winding portion 33, and are wound around the heat radiation plate 10 and the magnetic component 30 (Step S5). In this manner, the heat radiation plate 10 and the magnetic component 30 are brought into close contact with each other, and are fixed to each other.

Next, in the process C, the first heat-conducting material 50 is applied to the upper surface of the casing 20 (Step S6). Then, in the process D, the magnetic component 30 is inserted into the recessed portion 21 of the casing 20 so that the heat radiation plate 10 and the magnetic component 30, which are fixed to each other by the fixing bands 40, are mounted to the casing 20 (Step S7). Then, the lower surface of the heat radiation plate 10 is bonded to the upper surface of the casing 20 through intermediation of the first heat-conducting material (Step S8). At this time, the magnetic component 30 is accommodated in the recessed portion 21 of the casing 20, and parts of the fixing bands 40 provided so as to protrude from the lower surface of the lower core 32 of the magnetic component 30 are accommodated in the band accommodating grooves 22.

Figure 6:
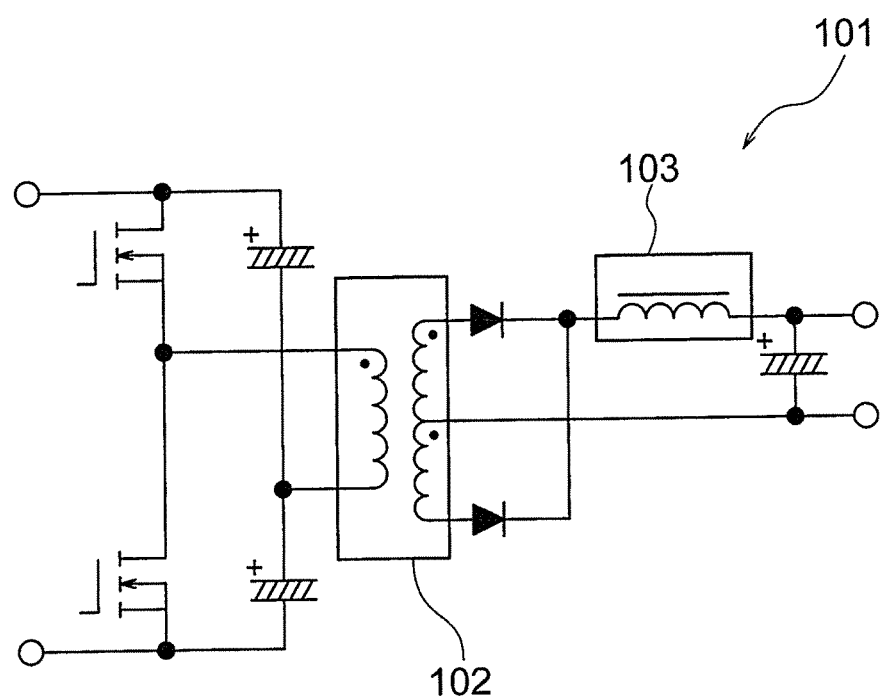
FIG. 6 is a circuit diagram for illustrating a usage example of the power conversion device illustrated in FIG. 1.

As illustrated in FIG. 6, the magnetic component 30 of the power conversion device 100 is used as an isolated flyback converter 101 including a transformer 102 and a coil 103. Besides that, the magnetic component 30 of the power conversion device 100 may be used in a general converter (step-up circuit, step-down circuit, or step-up/step-down circuit), an inverter, or a circuit for eliminating noise.

As described above, in the recessed portion 21 of the casing 20 of the power conversion device 100 according to this embodiment, the band accommodating grooves 22 for accommodating parts of the fixing bands 40 are formed. That is, at least a part of each of the fixing bands 40 is accommodated in the band accommodating groove 22 formed in the recessed portion 21 of the casing 20. In this manner, backlash to be caused when the magnetic component 30 and the casing 20 are brought into contact with each other is prevented, and thus the assembly dimensional tolerance caused between the casing 20 and the heat radiation plate 10 is eliminated. Further, a space required for the fixing bands 40 is reduced from the recessed portion 21 of the casing 20, and thus downsizing of the power conversion device 100 can be achieved. Further, a part of the lower core 32 of the magnetic component 30 can be thermally coupled to the casing 20, and hence the efficiency of cooling the magnetic component 30 can be further improved.

Further, the first heat-conducting material 50 formed of a resin is provided between the casing 20 and the heat radiation plate 10. In this manner, the assembly dimensional tolerance to be caused by unevenness or inclination between the casing 20 and the heat radiation plate 10 is eliminated. Therefore, the heat radiation plate 10 and the upper core 31 of the magnetic component 30 can be reliably brought into close contact with each other. Thus, the efficiency of cooling the magnetic component 30 is increased, and the output of the power conversion device 100 can be increased.

Further, part of heat of the magnetic component 30 is transferred to the casing 20 via the heat radiation plate 10 and the first heat-conducting material 50, and is then radiated to an atmosphere. Therefore, when the first heat-conducting material 50 is provided between the casing 20 and the heat radiation plate 10, the heat radiation performance of the power conversion device 100 can be improved.

Further, the winding portion 33 has the band mounting holes 34 for allowing the fixing bands 40 to be inserted therethrough. In this manner, a movable range in the horizontal direction of the winding portion 33 is limited by the fixing bands 40, and the winding portion 33 can be more stably fixed. Further, without an increase in lengths of the fixing bands 40, the magnetic component 30 can be more reliably fixed to the heat radiation plate 10. Further, it is not required to externally wind the fixing bands 40 around the winding portion 33, and hence a space required for the magnetic component 30 in the recessed portion 21 of the casing 20 can be reduced. Therefore, the downsizing of the power conversion device 100 can be more reliably achieved.

With reference to FIG. 7 to FIG. 26, description is given below of modification examples of the power conversion device 100.

FIG. 7 to FIG. 13D are illustrations of modification examples of the process of assembling the power conversion device 100. Processes A to D and Steps S1 to S8 illustrated in FIG. 7 to FIG. 13D represent processes corresponding to the processes A to D and Steps S1 to S8 illustrated in FIG. 5, and description of the same operation process is omitted.

Figure 7:
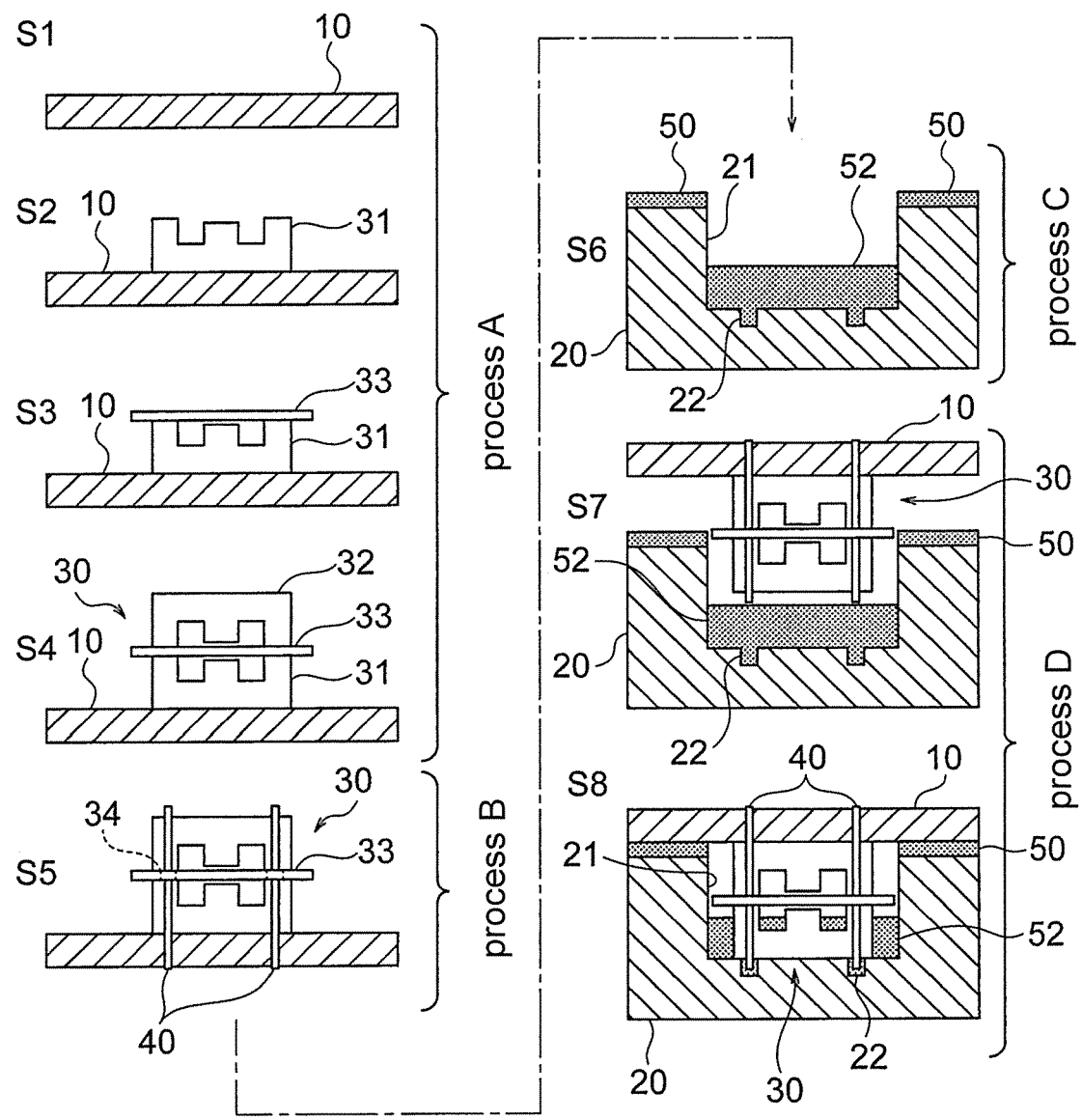
FIG. 7 is a view for illustrating another example of the process of assembling the power conversion device illustrated in FIG. 1.

In the process C illustrated in FIG. 7, in Step S6, a resin is injected as a second heat-conducting material 52 into the recessed portion 21 of the casing 20 up to a part of the depth of the recessed portion 21. After that, in Steps S7 and S8, the magnetic component 30 is accommodated in the recessed portion 21 of the casing 20 so as to put the lower core 32 into the second heat-conducting material 52.

Figure 8:
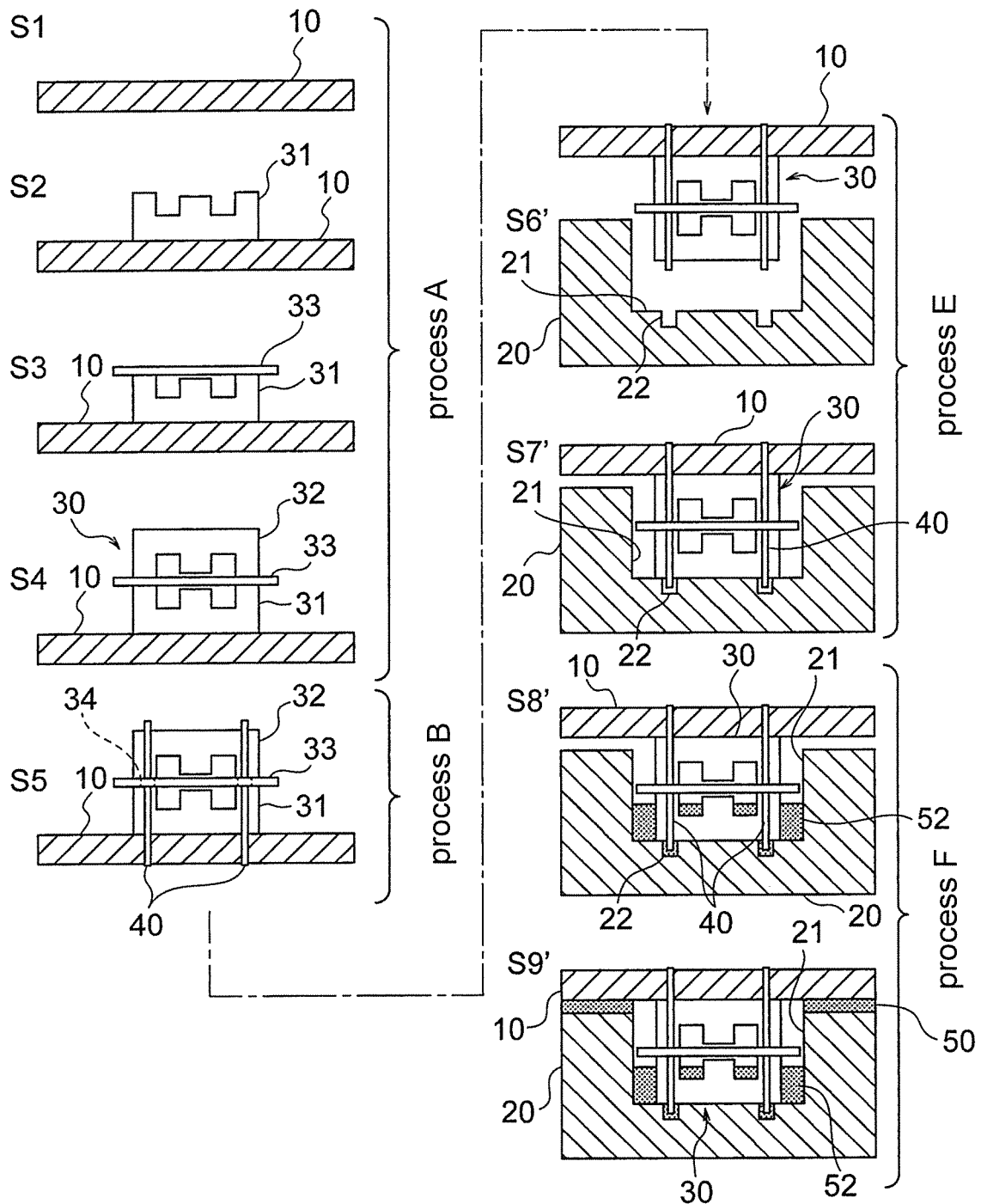
FIG. 8 is a view for illustrating another example of the process of assembling the power conversion device illustrated in FIG. 1.

Further, the process A and the process B illustrated in FIG. 8 are similar to the process A and the process B illustrated in FIG. 5, respectively. A process E following the process B is a process of accommodating the magnetic component 30 assembled in the process B into the recessed portion 21 of the casing 20. Further, a process F is a process of adding the first heat-conducting material 50 and the second heat-conducting material 52 to the magnetic component 30 and the casing 20.

Specifically, in Step S6' and Step S7' of the process E following Step S5, the magnetic component 30 is accommodated in the recessed portion 21 of the casing 20. Then, the processing proceeds to the process F, and in Step S8', the resin is injected as the second heat-conducting material 52 up to a part of the depth of the recessed portion 21. Then, in Step S9', the first heat-conducting material 50 is injected between the heat radiation plate 10 and the casing 20.

Figure 9A:
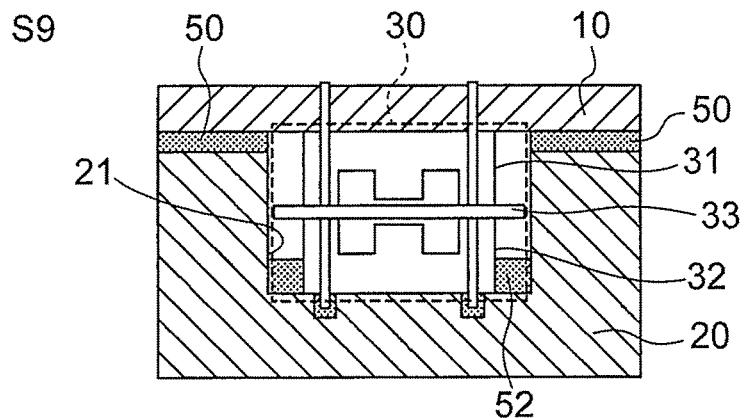
FIG. 9A is a view for illustrating another example of the process of assembling the power conversion device illustrated in FIG. 1, and is a view for illustrating Step S9.
Figure 9B:
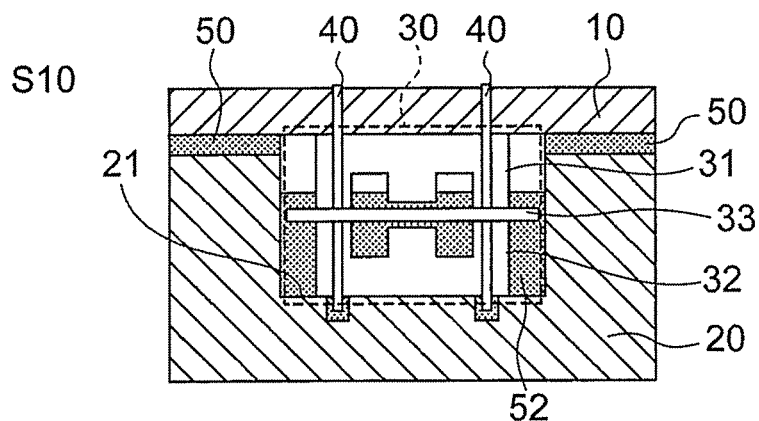
FIG. 9B is a view for illustrating another example of the process of assembling the power conversion device illustrated in FIG. 1, and is a view for illustrating Step S10.
Figure 9C:
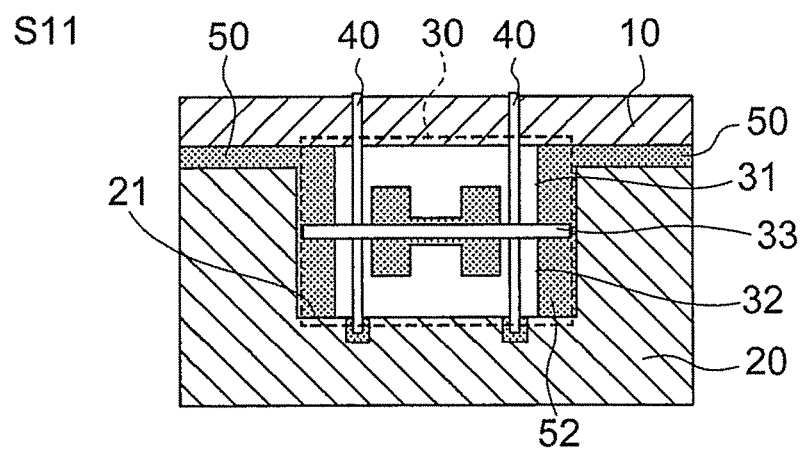
FIG. 9C is a view for illustrating another example of the process of assembling the power conversion device illustrated in FIG. 1, and is a view for illustrating Step S11.

Further, after Steps S1 to S8 illustrated in FIG. 5, as illustrated in Steps S9 of FIG. 9A to S11 of FIG. 9, the recessed portion 21 of the casing 20 can be filled with the second heat-conducting material 52 without a gap.

As illustrated in FIG. 8, FIG. 9A, FIG. 9B, and FIG. 9, the second heat-conducting material 52 is injected to be provided in a part or the entire part of the recessed portion 21 of the casing 20. In this manner, the efficiency of cooling the magnetic component 30 is further improved.

Figure 10:
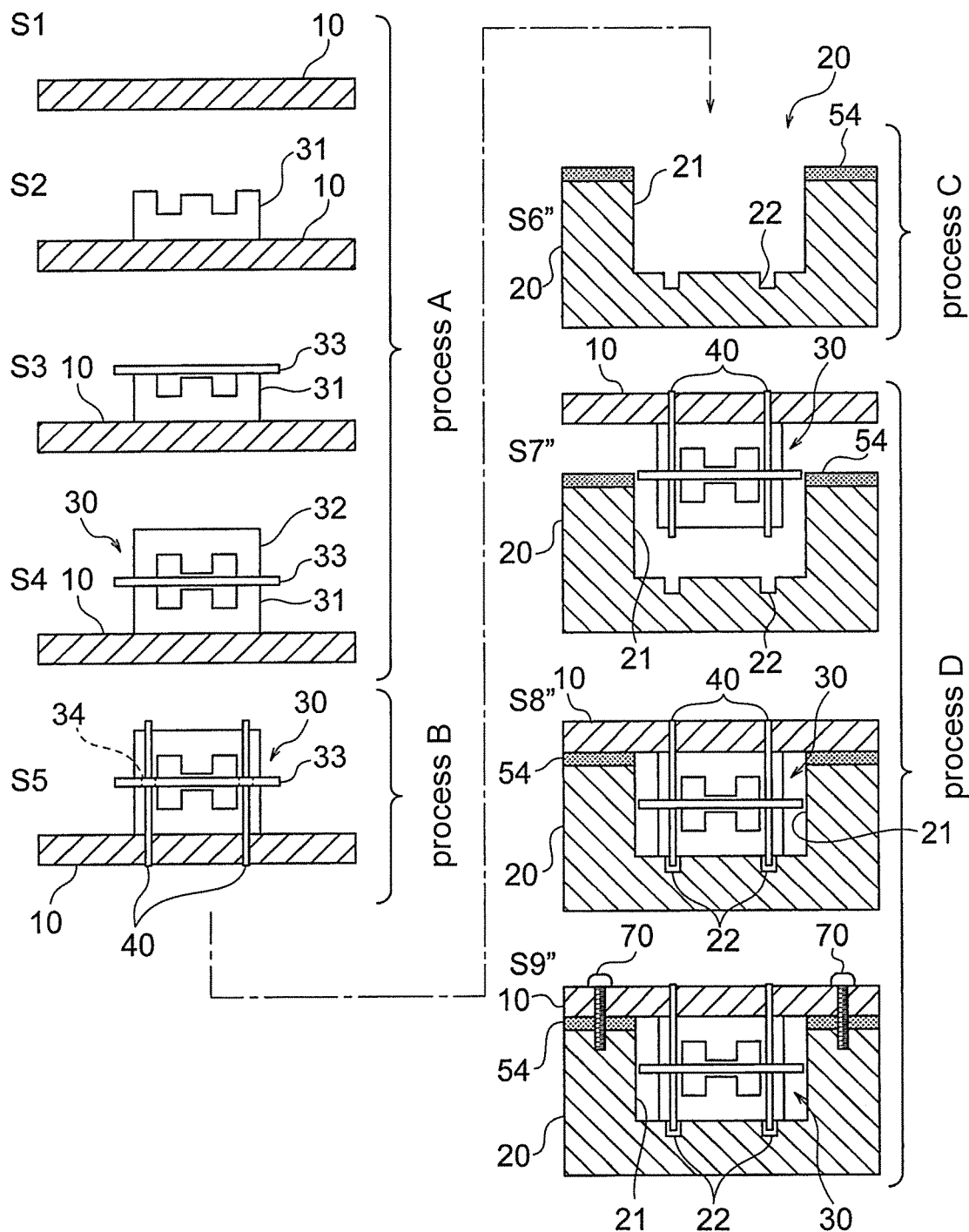
FIG. 10 is a view for illustrating another example of the process of assembling the power conversion device illustrated in FIG. 1.

Further, as illustrated in FIG. 10, in Step S6" of the process C, in place of the first heat-conducting material 50 being the resin, a sheet-shaped third heat-conducting material 54 may be placed on the upper surface of the casing 20. The third heat-conducting material 54 is a heat transfer sheet having elasticity, which is often used as, for example, thermal interface materials. The third heat-conducting material 54 has a heat conductivity equivalent to or more than the heat conductivity of the first heat-conducting material 50. In Step S7" and Step S8" of the process D, the third heat-conducting material 54 is sandwiched between the heat radiation plate 10 and the casing 20. Then, in Step S9", the heat radiation plate 10 and the casing 20 having the third heat-conducting material 54 sandwiched therebetween are fixed by screws 70.

In this manner, the assembly dimensional tolerance to be caused when the heat radiation plate 10 and the magnetic component 30 are mounted to the casing 20 can be absorbed by the elasticity of the third heat-conducting material 54.

Figure 11:
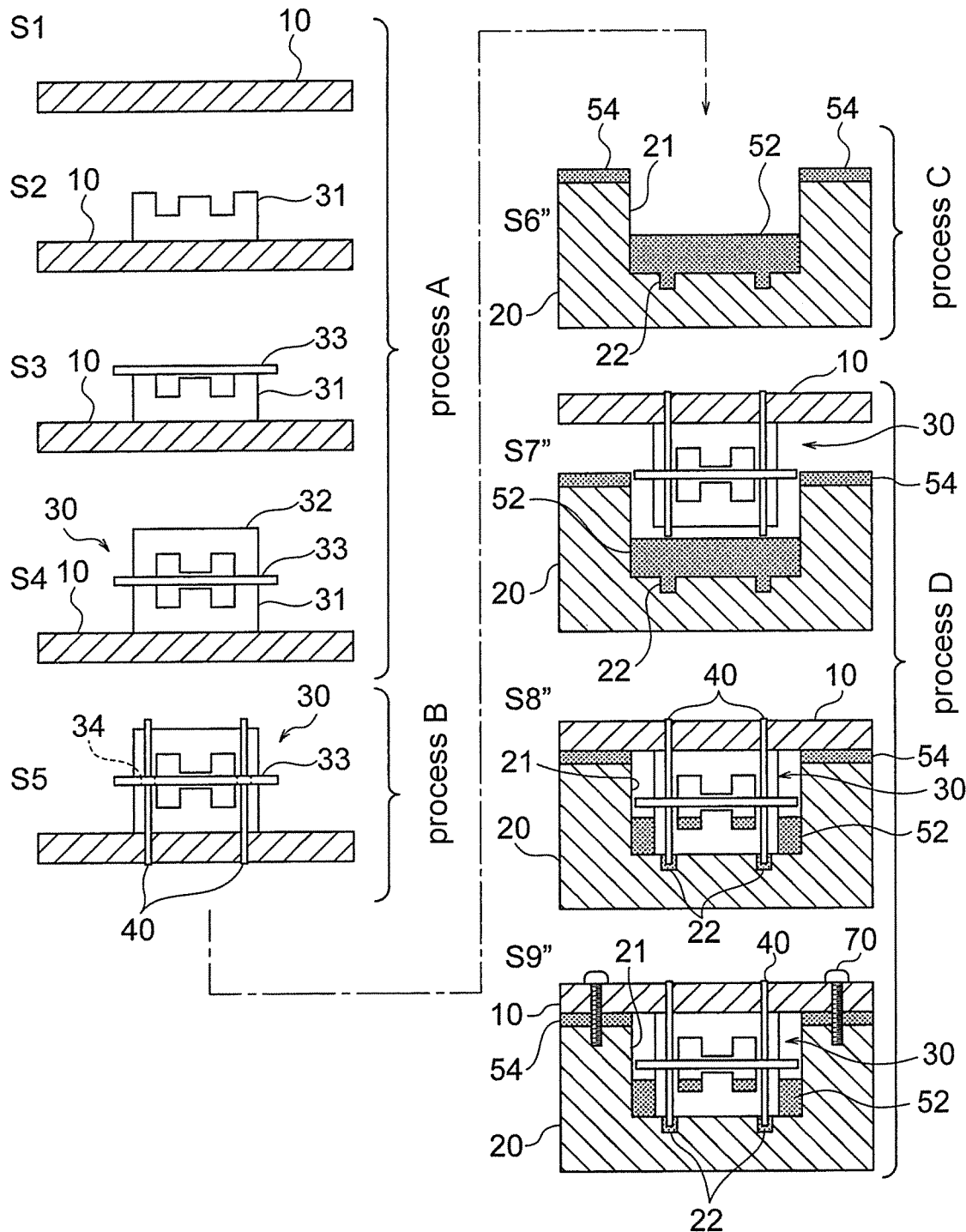
FIG. 11 is a view for illustrating another example of the process of assembling the power conversion device illustrated in FIG. 1.

Further, as illustrated in FIG. 11, in Step S6" of the process C, the third heat-conducting material 54 may be placed on the upper surface of the casing 20, and the resin may be injected as the second heat-conducting material 52 into the recessed portion 21 of the casing 20 up to a part of the depth of the recessed portion 21. After that, the processing proceeds to the process D, and in Steps S7" and S8", the magnetic component 30 is accommodated in the recessed portion 21 of the casing 20 so as to put the lower core 32 into the second heat-conducting material 52. Further, in Step S9", the heat radiation plate 10 and the casing 20 having the third heat-conducting material 54 sandwiched therebetween are fixed by the screws 70.

Figure 12:
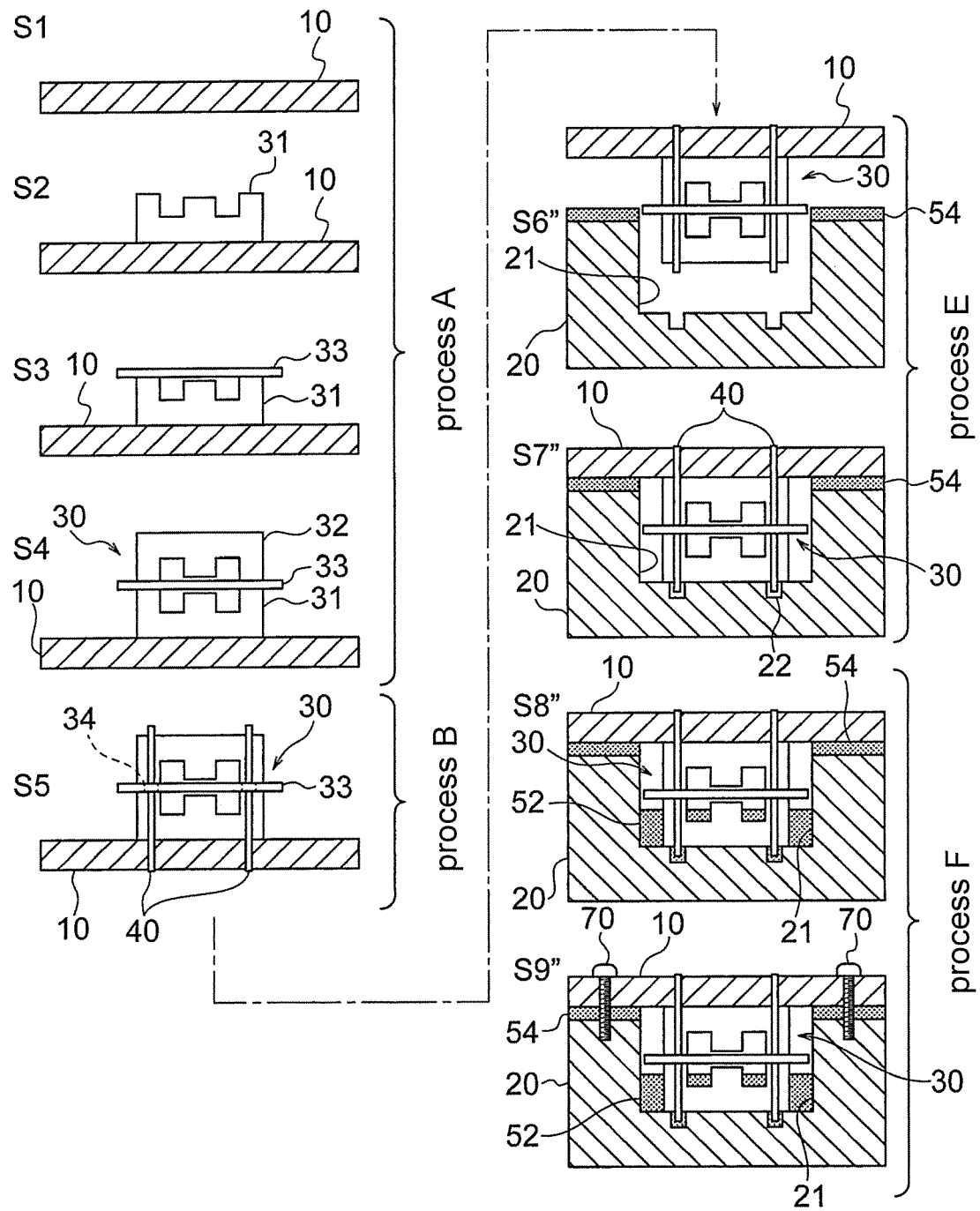
FIG. 12 is a view for illustrating another example of the process of assembling the power conversion device illustrated in FIG. 1.
Figure 13A:
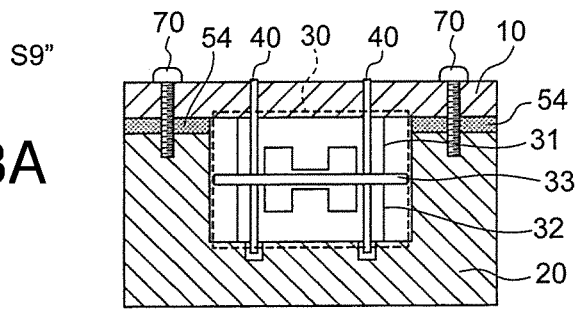
FIG. 13A is a view for illustrating another example of the process of assembling the power conversion device illustrated in FIG. 1, and is a view for illustrating Step S9".
Figure 13B:
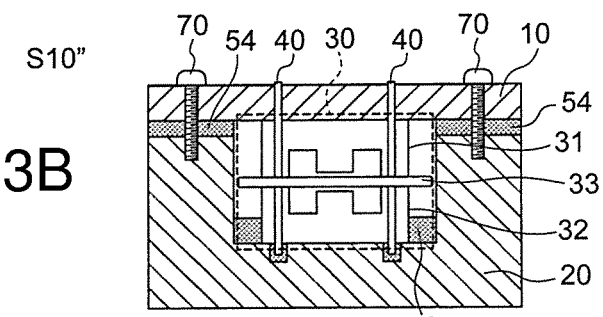
FIG. 13B is a view for illustrating another example of the process of assembling the power conversion device illustrated in FIG. 1, and is a view for illustrating Step S10".
Figure 13C:
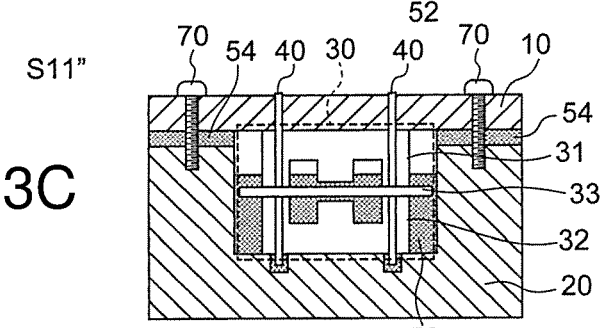
FIG. 13C is a view for illustrating another example of the process of assembling the power conversion device illustrated in FIG. 1, and is a view for illustrating Step S11".
Figure 13D:
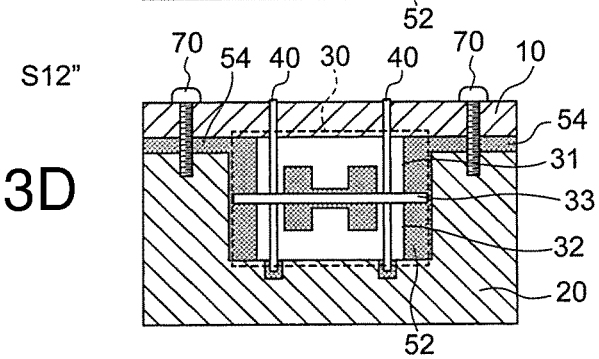
FIG. 13D is a view for illustrating another example of the process of assembling the power conversion device illustrated in FIG. 1, and is a view for illustrating Step S12".

Further, in the process E and the process F illustrated in FIG. 12, in Step S6", the third heat-conducting material 54 is placed on the upper surface of the casing 20, and in Step S7", the magnetic component 30 is accommodated in the recessed portion 21 of the casing 20. Then, the processing proceeds to the process F, and in Step S8", the resin is injected as the second heat-conducting material 52 up to a part of the depth of the recessed portion 21. Then, in Step S9", the heat radiation plate 10 and the casing 20 having the third heat-conducting material 54 sandwiched therebetween are fixed by the screws 70.

Further, as illustrated in FIG. 13A to FIG. 13D, in Step S9" illustrated in FIG. 10, the heat radiation plate 10 and the casing 20 having the third heat-conducting material 54 sandwiched therebetween may be fixed by the screws 70, and then, in Steps S10" to S12", the recessed portion 21 of the casing 20 may be filled with the second heat-conducting material 52 without a gap.

Figure 14A:
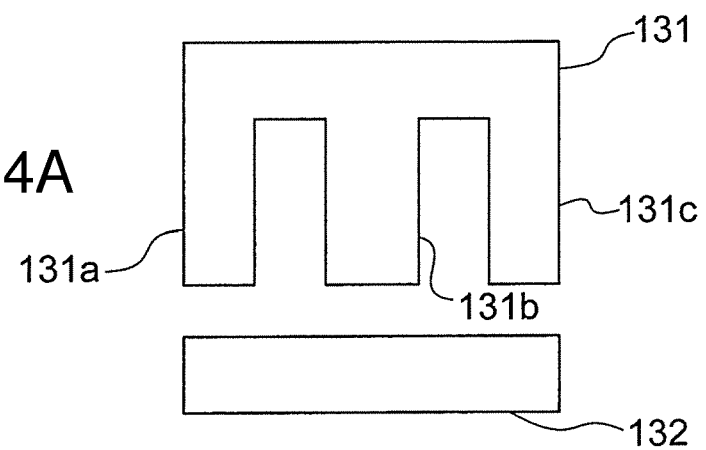
FIG. 14A is a side view for illustrating another examples of the shapes of the upper core and the lower core of the magnetic component of the power conversion device illustrated in FIG. 1.

Further, the shapes of the upper core 31 and the lower core 32 of the magnetic component 30 are not limited to those illustrated in FIG. 3. For example, as illustrated in FIG. 14A, the magnetic component 30 may include an E-shaped upper core 131 and an I-shaped lower core 132. Protruding portions 131a, 131b, and 131c of the upper core 131 have the same length.

Figure 14B:
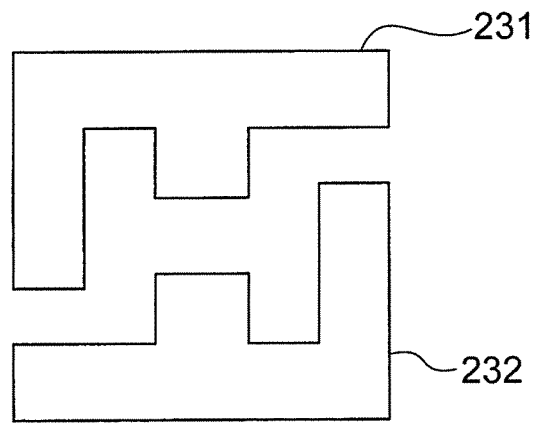
FIG. 14B is a side view for illustrating another example of the shapes of the upper core and the lower core of the magnetic component of the power conversion device illustrated in FIG. 1.

Further, as illustrated in FIG. 14B, the magnetic component 30 may include an F-shaped upper core 231 and an F-shaped lower core 232.

Figure 15A:
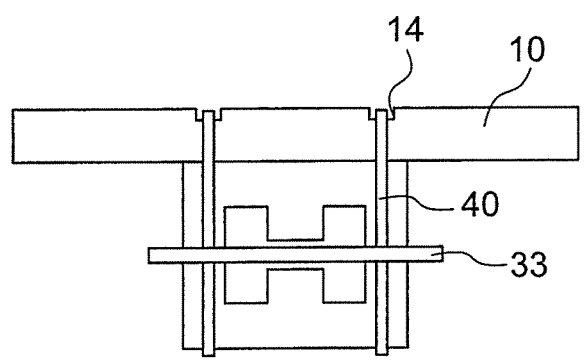
FIG. 15A is a view for illustrating another example of the assembly of the magnetic component and the heat radiation plate of the power conversion device illustrated in FIG. 1, and is a side view for illustrating the magnetic component and the heat radiation plate.
Figure 15B:
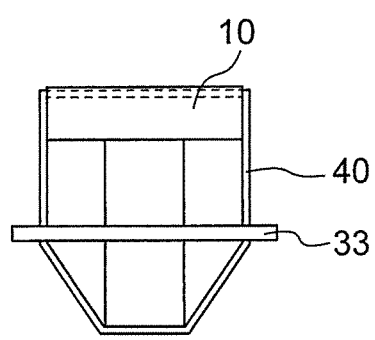
FIG. 15B is a view for illustrating another example of the assembly of the magnetic component and the heat radiation plate of the power conversion device illustrated in FIG. 1, is a front view for illustrating the magnetic component and the heat radiation plate.
Figure 15C:
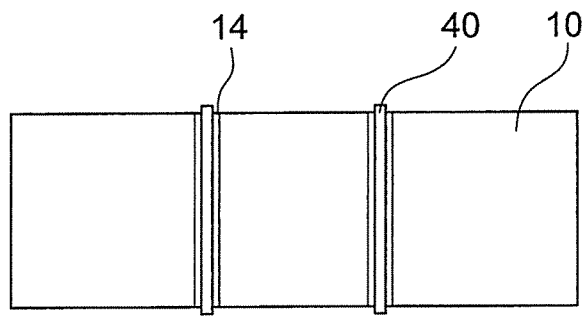
FIG. 15C is a view for illustrating another example of the assembly of the magnetic component and the heat radiation plate of the power conversion device illustrated in FIG. 1, is a top view for illustrating the magnetic component and the heat radiation plate.

Further, as illustrated in 15A to FIG. 15C, in the upper surface of the heat radiation plate 10, band engaging grooves 14 with which the fixing bands 40 are to be engaged may be formed.

Figure 16A:
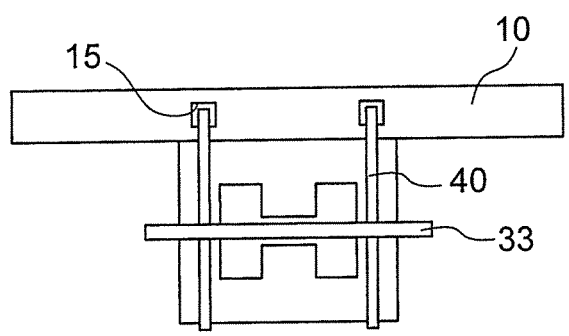
FIG. 16A is a view for illustrating another example of the assembly of the magnetic component and the heat radiation plate of the power conversion device illustrated in FIG. 1, and is a side view for illustrating the magnetic component and the heat radiation plate.
Figure 16B:
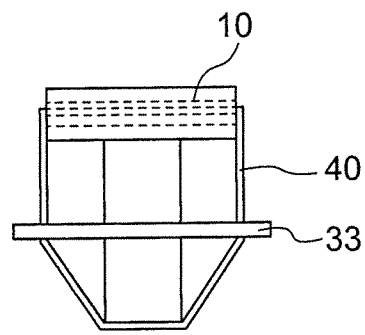
FIG. 16B is a view for illustrating another example of the assembly of the magnetic component and the heat radiation plate of the power conversion device illustrated in FIG. 1, is a front view for illustrating the magnetic component and the heat radiation plate.
Figure 16C:
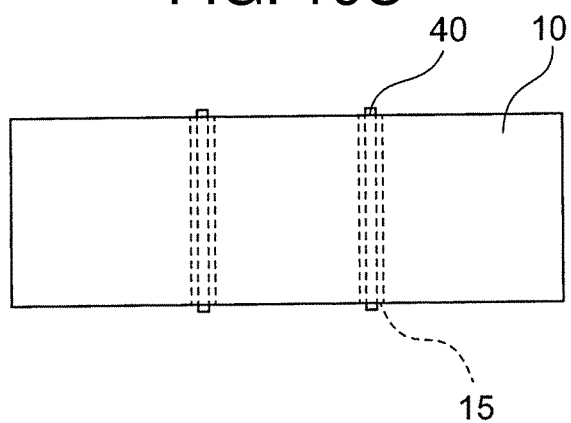
FIG. 16C is a view for illustrating another example of the assembly of the magnetic component and the heat radiation plate of the power conversion device illustrated in FIG. 1, is a top view for illustrating the magnetic component and the heat radiation plate.

Further, as illustrated in 16A to FIG. 16C, in the heat radiation plate 10, band inserting holes 15 through which the fixing bands 40 are to be inserted may be formed.

Figure 17A:
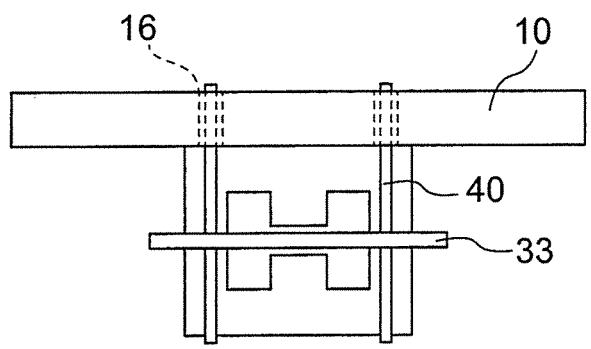
FIG. 17A is a view for illustrating another example of the assembly of the magnetic component and the heat radiation plate of the power conversion device illustrated in FIG. 1, and is a side view for illustrating the magnetic component and the heat radiation plate.
Figure 17B:
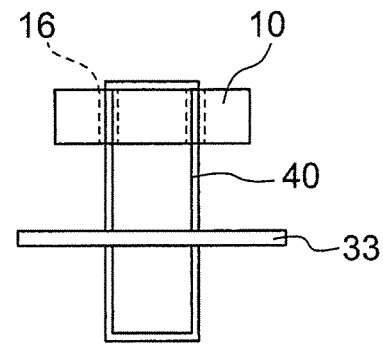
FIG. 17B is a view for illustrating another example of the assembly of the magnetic component and the heat radiation plate of the power conversion device illustrated in FIG. 1, and is a front view for illustrating the magnetic component and the heat radiation plate.
Figure 17C:
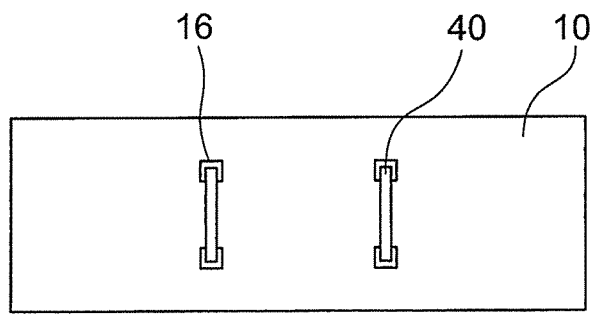
FIG. 17C is a view for illustrating another example of the assembly of the magnetic component and the heat radiation plate of the power conversion device illustrated in FIG. 1, and is a top view for illustrating the magnetic component and the heat radiation plate.

Further, as illustrated in 17A to FIG. 17C, in the heat radiation plate 10, band inserting holes 16 communicating between the upper surface and the lower surface of the heat radiation plate 10 may be formed. The fixing bands 40 are inserted through the band inserting holes 16.

Figure 18A:
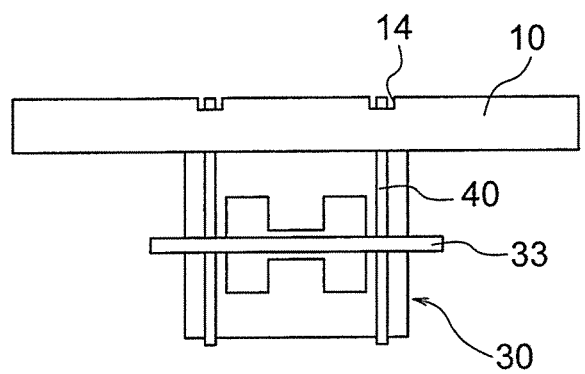
FIG. 18A is a view for illustrating another example of the assembly of the magnetic component and the heat radiation plate of the power conversion device illustrated in FIG. 1, and is a side view for illustrating the magnetic component and the heat radiation plate.
Figure 18B:
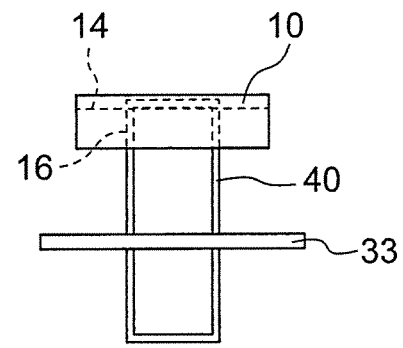
FIG. 18B is a view for illustrating another example of the assembly of the magnetic component and the heat radiation plate of the power conversion device illustrated in FIG. 1, and is a front view for illustrating the magnetic component and the heat radiation plate.
Figure 18C:
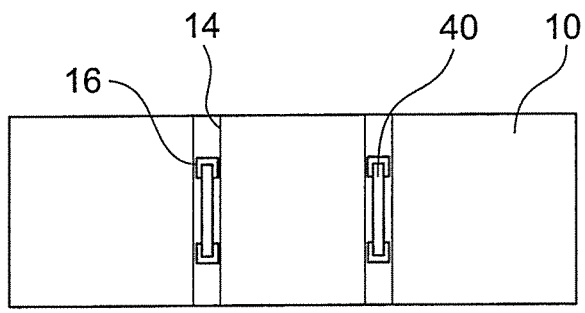
FIG. 18C is a view for illustrating another example of the assembly of the magnetic component and the heat radiation plate of the power conversion device illustrated in FIG. 1, and is a top view for illustrating the magnetic component and the heat radiation plate.

Further, as illustrated in 18A to FIG. 18C, in the heat radiation plate 10, both of the band inserting holes 16 and the band engaging grooves 14 may be formed.

Figure 19A:
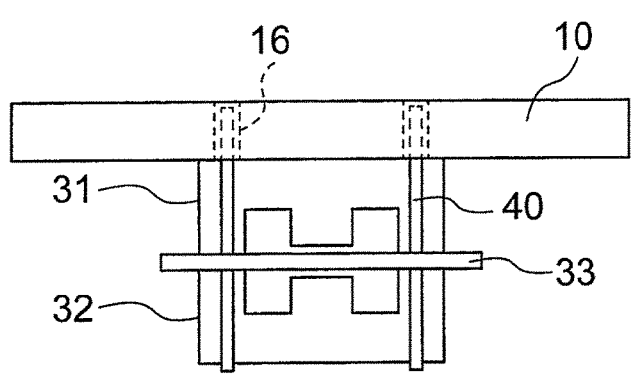
FIG. 19A is a view for illustrating another example of the assembly of the magnetic component and the heat radiation plate of the power conversion device illustrated in FIG. 1, and is a side view for illustrating the magnetic component and the heat radiation plate.
Figure 19B:
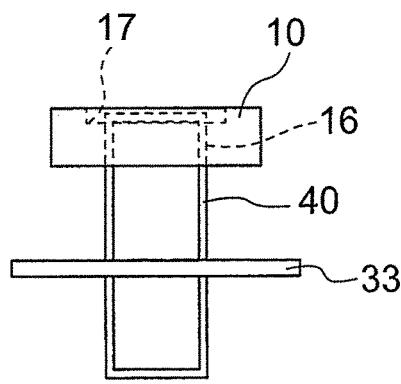
FIG. 19B is a view for illustrating another example of the assembly of the magnetic component and the heat radiation plate of the power conversion device illustrated in FIG. 1, and is a front view for illustrating the magnetic component and the heat radiation plate.
Figure 19C:
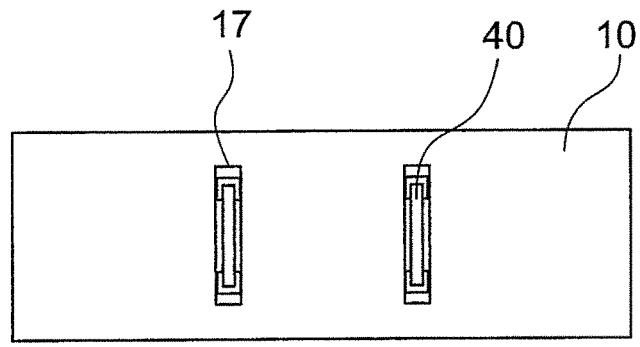
FIG. 19C is a view for illustrating another example of the assembly of the magnetic component and the heat radiation plate of the power conversion device illustrated in FIG. 1, and is a top view for illustrating the magnetic component and the heat radiation plate.

Further, as illustrated in 19A to FIG. 19C, in the heat radiation plate 10, band engaging grooves 17 serving as rectangular recessed parts may be formed. As illustrated in FIG. 19(b), the band inserting holes 16 communicate with the band engaging grooves 17 of the heat radiation plate 10.

As described above, in the heat radiation plate 10, the band engaging grooves 14 and 17 with which the fixing bands 40 are to be engaged or the band inserting holes 15 and 16 through which the fixing bands 40 are to be inserted are formed. In this manner, the positioning of the fixing bands 40 is easily performed, and the efficiency of assembling the power conversion device 100 is improved. Further, the positions of the fixing bands 40 are stabilized, and thus the heat radiation plate 10 and the magnetic component 30 can be more reliably fixed to each other.

Figure 20:
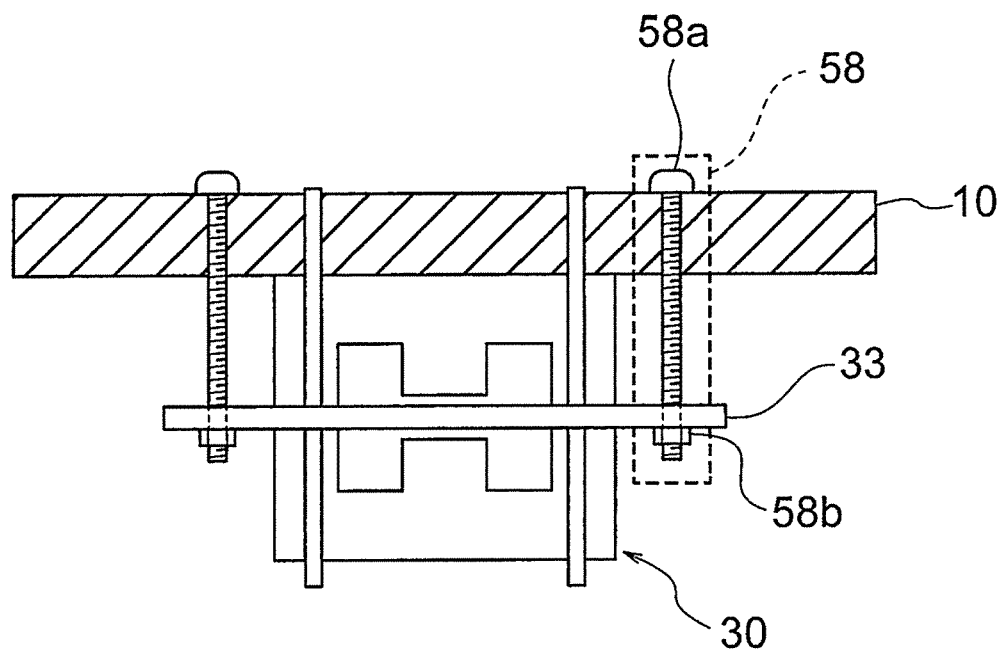
FIG. 20 is a side view for illustrating another example of the assembly of the magnetic component and the heat radiation plate of the power conversion device illustrated in FIG. 1.

Further, as illustrated in FIG. 20, the heat radiation plate 10 and the winding portion 33 are connected to each other by connection members 58. Each of the connection members 58 includes a bolt 58a and a nut 58b. In this manner, a movable range in the vertical and horizontal directions of the winding portion 33 is limited, and the position of the winding portion 33 can be stabilized. Further, the heat of the winding portion 33 is transferred to the heat radiation plate 10 and the atmosphere via the bolts 58a, and hence the efficiency of cooling the magnetic component 30 is further improved.

Figure 21:
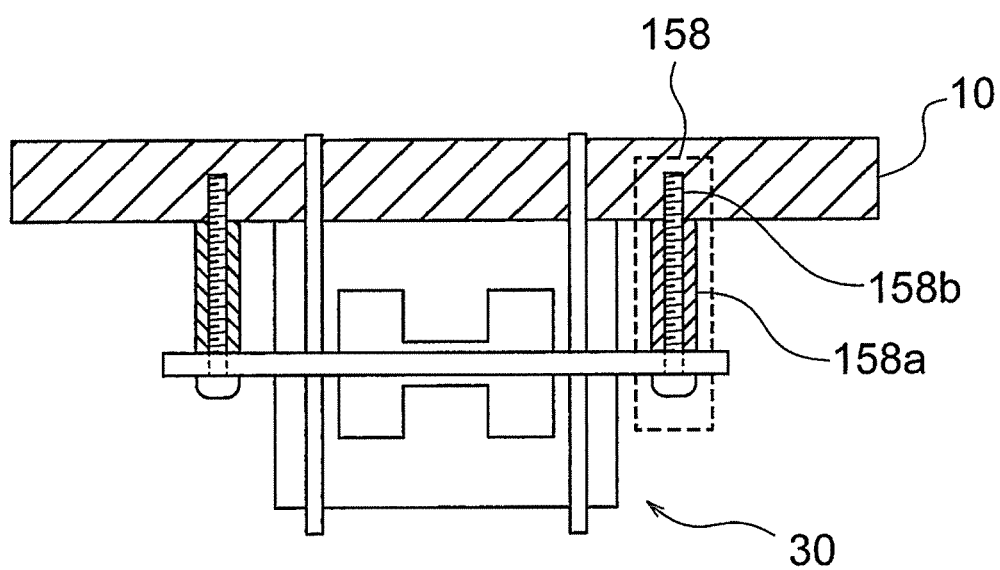
FIG. 21 is a side view for illustrating another example of the assembly of the magnetic component and the heat radiation plate of the power conversion device illustrated in FIG. 1.

Further, as illustrated in FIG. 21, each of connection members 158 for connecting the heat radiation plate and the winding portion 33 to each other may include a cylindrical spacer 158a and a bolt 158b. The spacer 158a is provided between the heat radiation plate 10 and the winding portion 33. The bolt 158b is inserted through the spacer 158a.

Figure 22:
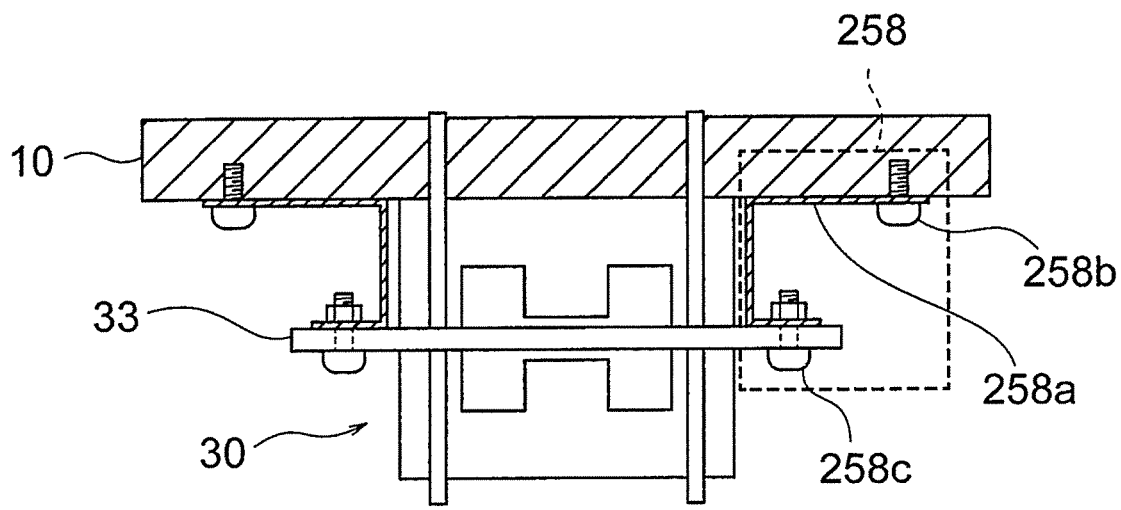
FIG. 22 is a side view for illustrating another example of the assembly of the magnetic component and the heat radiation plate of the power conversion device illustrated in FIG. 1.

Further, as illustrated in FIG. 22, each of connection members 258 for connecting the heat radiation plate 10 and the winding portion 33 to each other may include a steel sheet 258a that is bent into an L shape. The steel sheet 258a is fixed to the heat radiation plate 10 by a bolt 258b. Further, the steel sheet 258a is fixed to the winding portion 33 by a bolt 258c.

Figure 23:
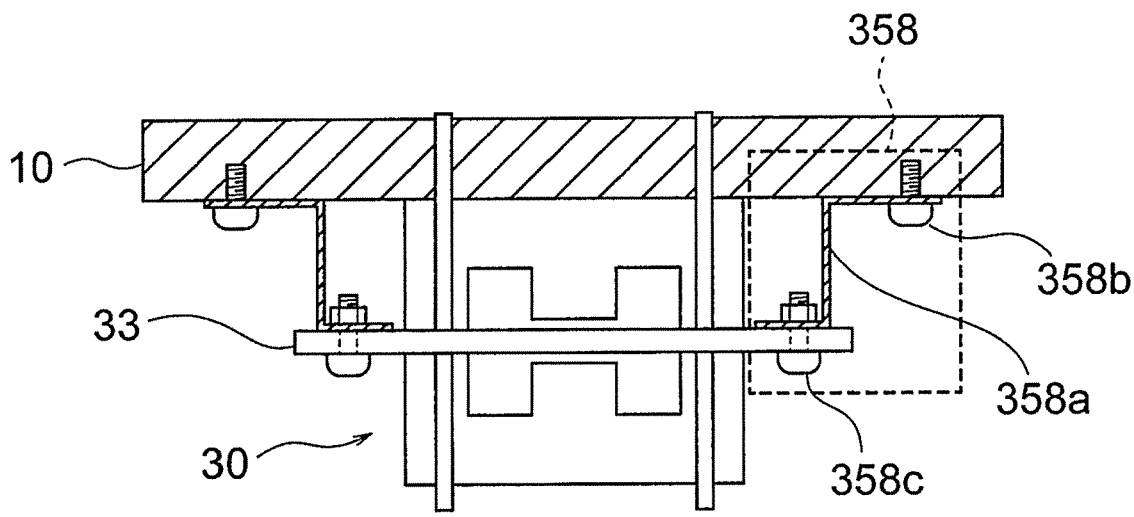
FIG. 23 is a side view for illustrating another example of the assembly of the magnetic component and the heat radiation plate of the power conversion device illustrated in FIG. 1.

Further, each of connection members 358 illustrated in FIG. 23 similarly includes a bent steel sheet 358a. The steel sheet 358a is fixed to the heat radiation plate 10 by a bolt 258b, and is fixed to the winding portion 33 by a bolt 258c.

Figure 24A:
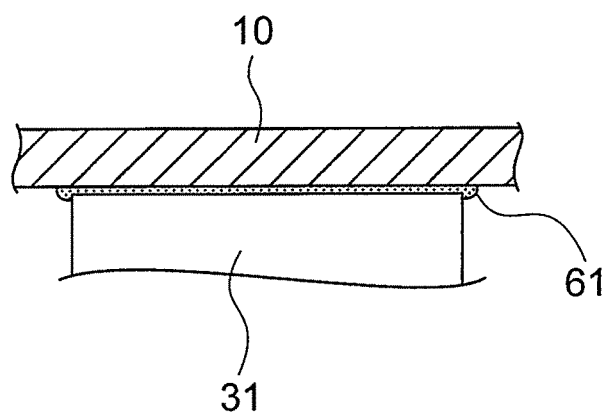
FIG. 24A is a partial enlarged view for illustrating another example of a connection part between the heat radiation plate and the upper core of the magnetic component of the power conversion device illustrated in FIG. 1.

Further, as illustrated in FIG. 24A, a resin serving as a fourth heat-conducting material 61 may be applied and provided between the heat radiation plate 10 and the upper core 31.

Figure 24B:
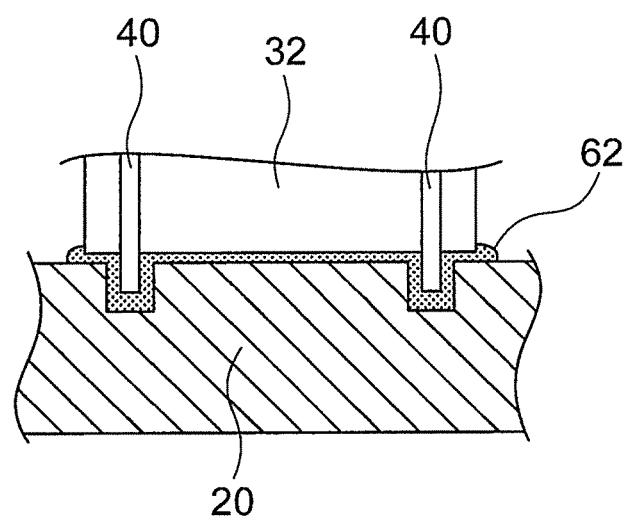
FIG. 24B is a partial enlarged view for illustrating another example of a connection part between the casing and the lower core of the magnetic component of the power conversion device illustrated in FIG. 1.

Further, as illustrated in FIG. 24B, a resin serving as a fifth heat-conducting material 62 may be applied and provided between the casing 20 and the lower core 32 and between the casing 20 and each of the fixing bands 40.

The fourth heat-conducting material 61 and the fifth heat-conducting material 62 are each a silicon compound or grease. The fourth heat-conducting material 61 and the fifth heat-conducting material 62 each have a thickness of from several microns to several tens of microns.

When the fourth heat-conducting material 61 and the fifth heat-conducting material 62 are provided, the heat radiation performance of the power conversion device 100 is further improved.

Figure 25A:
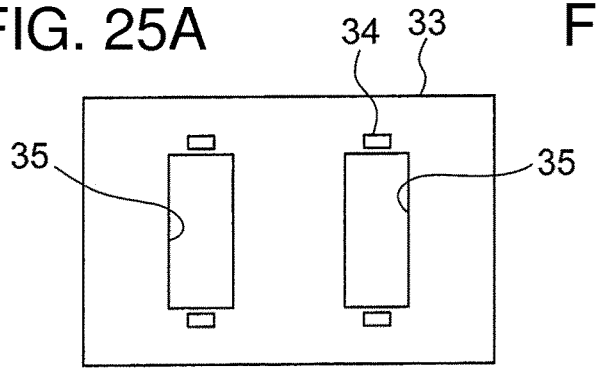
FIG. 25A is a view for illustrating modification examples of a shape of a winding portion of the magnetic component of the power conversion device illustrated in FIG. 1.
Figure 25E:
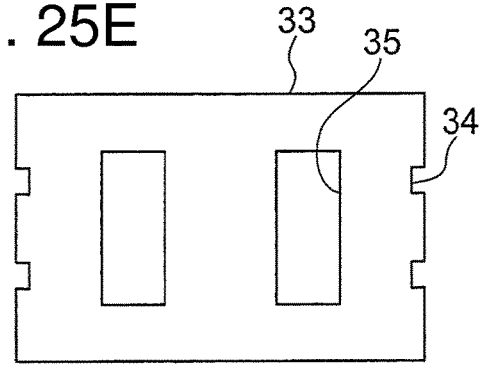
FIG. 25E is a view for illustrating modification example of a shape of a winding portion of the magnetic component of the power conversion device illustrated in FIG. 1.
Figure 25B:
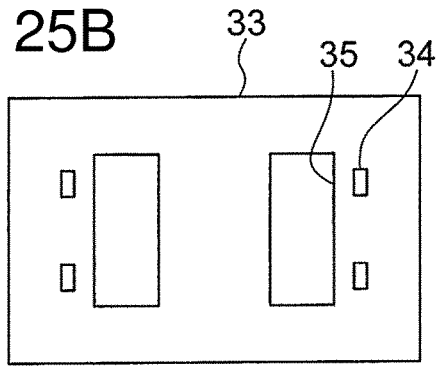
FIG. 25B is a view for illustrating modification example of a shape of a winding portion of the magnetic component of the power conversion device illustrated in FIG. 1.
Figure 25F:
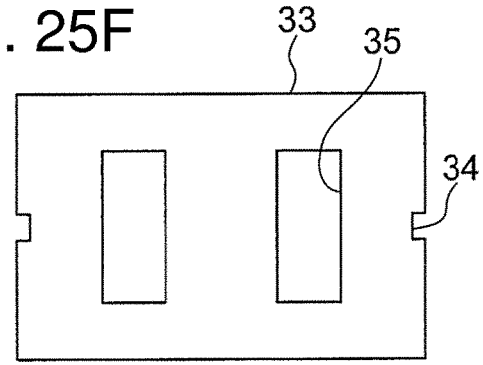
FIG. 25F is a view for illustrating modification example of a shape of a winding portion of the magnetic component of the power conversion device illustrated in FIG. 1.
Figure 25C:
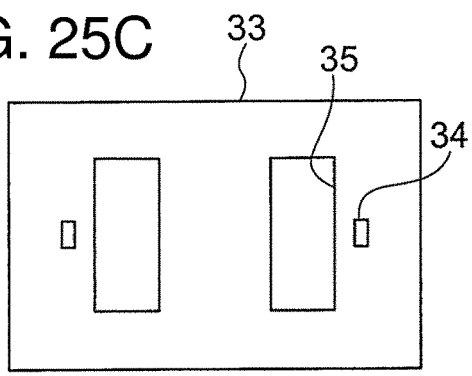
FIG. 25C is a view for illustrating modification example of a shape of a winding portion of the magnetic component of the power conversion device illustrated in FIG. 1.
Figure 25G:
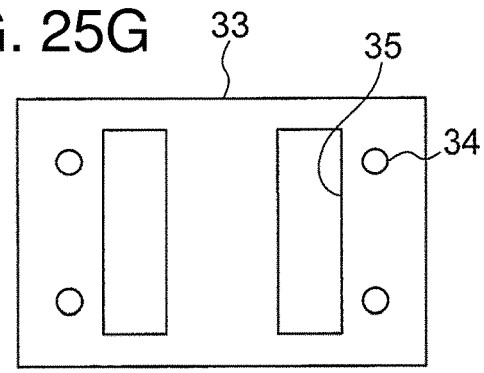
FIG. 25G is a view for illustrating modification example of a shape of a winding portion of the magnetic component of the power conversion device illustrated in FIG. 1.
Figure 25D:
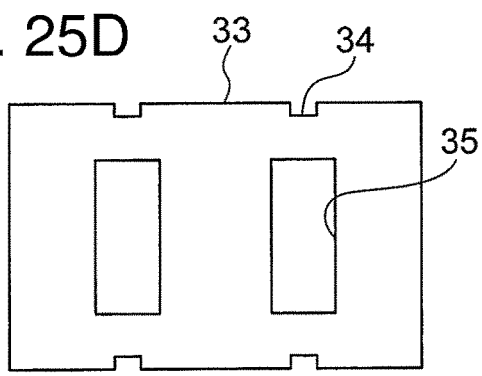
FIG. 25D is a view for illustrating modification example of a shape of a winding portion of the magnetic component of the power conversion device illustrated in FIG. 1.
Figure 25H:
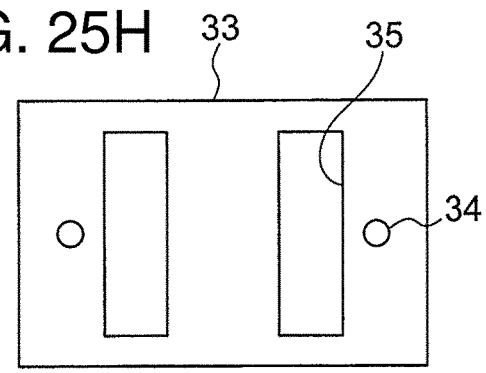
FIG. 25H is a view for illustrating modification example of a shape of a winding portion of the magnetic component of the power conversion device illustrated in FIG. 1.

Further, as illustrated in 25A to FIG. 25H, the band mounting holes 34 of the winding portion 33 can be formed into various shapes.

Specifically, in the winding portion 33, there is formed a pair of core engaging holes 35 to be engaged with the protruding portions 31a and 31b of the upper core 31 and the protruding portions 32a and 32b of the lower core 32. In FIG. 25A, each of the band mounting holes 34 has a rectangular shape. Four band mounting holes 34 are formed on the outer side of the core engaging holes 35 in a short-side direction of the winding portion 33. Further, as illustrated in FIG. 25B, the four band mounting holes 34 may be formed on the outer side of the core engaging holes 35 in a long-side direction of the winding portion 33. Further, as illustrated in FIG. 25C, two rectangular band mounting holes 34 may be formed in the winding portion 33.

Further, as illustrated in FIG. 25D to FIG. 25F, the band mounting holes 34 may be cutouts formed in an outer periphery of the winding portion 33.

Further, as illustrated in FIG. 25G and FIG. 25H, each of the band mounting holes 34 may have a circular shape.

Further, the band inserting holes 16 of the heat radiation plate 10 illustrated in FIG. 17A to FIG. 17C may have shapes as those illustrated in FIG. 26A to FIG. 26H so as to conform to the shapes of the band mounting holes 34 of the winding portion 33 illustrated in FIG. 25A to FIG. 25H.

Figure 26A:
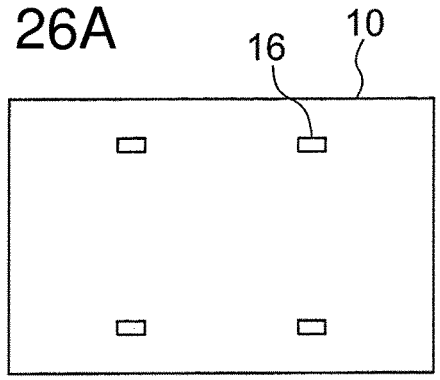
FIG. 26A is a view for illustrating modification examples of a shape of the heat radiation plate of the power conversion device illustrated in FIG. 1.
Figure 26E:
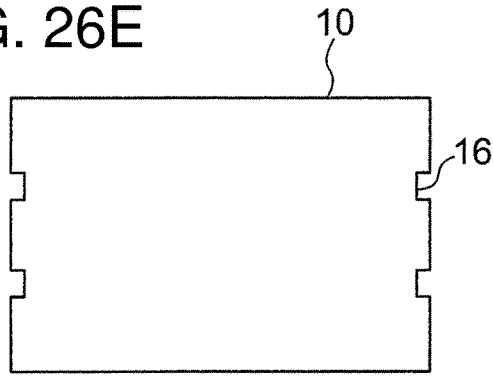
FIG. 26E is a view for illustrating modification example of a shape of the heat radiation plate of the power conversion device illustrated in FIG. 1.
Figure 26B:
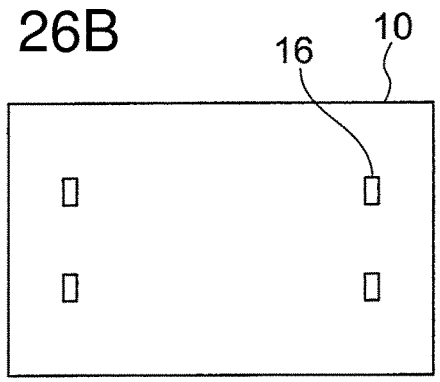
FIG. 26B is a view for illustrating modification example of a shape of the heat radiation plate of the power conversion device illustrated in FIG. 1.

Specifically, as illustrated in FIG. 26A and FIG. 26B, the band inserting holes 16 formed in the heat radiation plate 10 may be four rectangular holes. Further, as illustrated in FIG. 26C, the heat radiation plate 10 may have two band inserting holes 16.

Figure 26F:
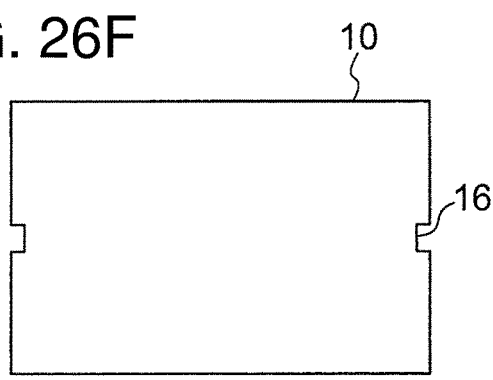
FIG. 26F is a view for illustrating modification example of a shape of the heat radiation plate of the power conversion device illustrated in FIG. 1.
Figure 26C:
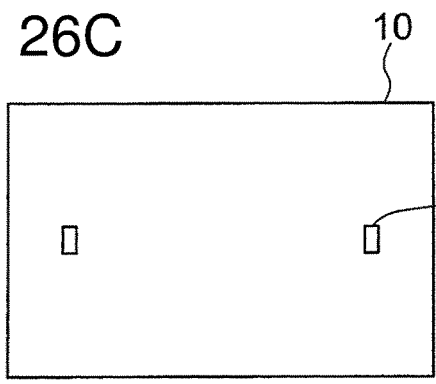
FIG. 26C is a view for illustrating modification example of a shape of the heat radiation plate of the power conversion device illustrated in FIG. 1.
Figure 26G:
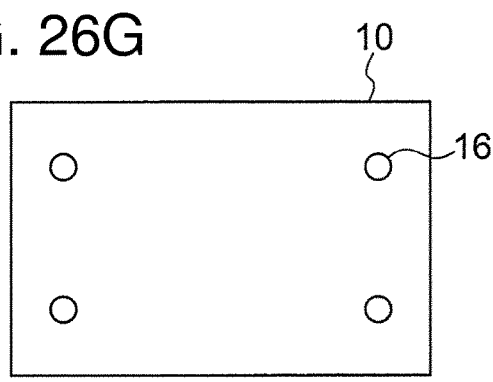
FIG. 26G is a view for illustrating modification example of a shape of the heat radiation plate of the power conversion device illustrated in FIG. 1.
Figure 26D:
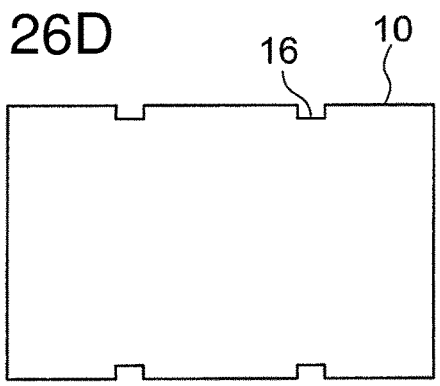
FIG. 26D is a view for illustrating modification example of a shape of the heat radiation plate of the power conversion device illustrated in FIG. 1.

Further, as illustrated in FIG. 26D to FIG. 26F, the band inserting holes 16 may be cutouts formed in an outer periphery of the heat radiation plate 10.

Figure 26H:
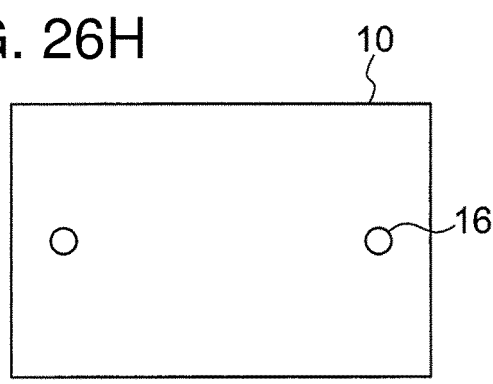
FIG. 26H is a view for illustrating modification example of a shape of the heat radiation plate of the power conversion device illustrated in FIG. 1.

Further, as illustrated in FIG. 26G and FIG. 26H, each of the band inserting holes 16 may have a circular shape.

As an area in which the lower core 32 of the magnetic component 30 and the casing 20 are thermally coupled to each other is increased, the heat radiation performance is increased, and hence it is preferred that the width of the fixing band 40 and the width of the band accommodating groove 22 be as narrow as possible.

Further, in this embodiment, two fixing bands 40 are used to fix the heat radiation plate 10 and the magnetic component 30 to each other, but the present invention is not limited thereto. The number of the fixing bands 40 may be one, or may be three or more within a range not affecting the heat radiation performance.

REFERENCE SIGNS LIST 10 heat radiation plate, 14, 17 band engaging groove, 15, 16 band inserting hole, 20 casing, 21 recessed portion, 22 band accommodating groove, 30 magnetic component, 31 upper core, 32 lower core, 33 winding portion, 34 band mounting hole, 40 fixing band, 50 first heat-conducting material, 52 second heat-conducting material, 54 third heat-conducting material, 61 fourth heat-conducting material, 62 fifth heat-conducting material, 100 power conversion device

The invention claimed is:

1. A power conversion device, comprising:
   a casing having a recessed portion;
   a magnetic component accommodated in the recessed portion of the casing;
   a heat radiation plate, which covers an opening of the recessed portion of the casing, and is thermally coupled to the magnetic component; and
   a fixing band wound around the magnetic component and around a surface of the heat radiation plate facing away from the magnetic component to fix the magnetic component to the heat radiation plate.

2. The power conversion device according to claim 1, further comprising a first heat-conducting material, which is provided between the casing and the heat radiation plate, and is formed of a resin.

3. The power conversion device according to claim 1, further comprising a sheet-shaped third heat-conducting material, which is provided between the casing and the heat radiation plate, and has elasticity.

4. The power conversion device according to claim 1, wherein the magnetic component includes:
   an upper core thermally coupled to the heat radiation plate;
   a lower core, which is provided so as to be opposed to the upper core, and is thermally coupled to the casing; and
   a winding portion provided between the upper core and the lower core.

5. The power conversion device according to claim 4, wherein the winding portion has a band mounting hole for allowing the fixing band to be inserted therethrough.

6. The power conversion device according to claim 4, wherein the heat radiation plate has a band engaging groove for allowing the fixing band to be engaged therewith, or a band inserting hole for allowing the fixing band to be inserted therethrough.

7. The power conversion device according to claim 1, further comprising a second heat-conducting material, which is provided in at least a part of the recessed portion of the casing, and is formed of a resin.

8. The power conversion device according to claim 1, further comprising a fourth heat-conducting material, which is provided between the magnetic component and the heat radiation plate, and is formed of a resin.

9. The power conversion device according to claim 1, further comprising a fifth heat-conducting material, which is provided between the magnetic component and the casing, and is formed of a resin.

10. The power conversion device according to claim 1, wherein at least a part of the fixing band is accommodated in a band accommodating groove formed in the recessed portion of the casing.

11. The power conversion device according to claim 10, further comprising a first heat-conducting material, which is provided between the casing and the heat radiation plate, and is formed of a resin.

12. The power conversion device according to claim 10, further comprising a sheet-shaped third heat-conducting material, which is provided between the casing and the heat radiation plate, and has elasticity.

13. The power conversion device according to claim 10, wherein the magnetic component includes:
    an upper core thermally coupled to the heat radiation plate;
    a lower core, which is provided so as to be opposed to the upper core, and is thermally coupled to the casing; and
    a winding portion provided between the upper core and the lower core.

14. The power conversion device according to claim 13, wherein the winding portion has a band mounting hole for allowing the fixing band to be inserted therethrough.

15. The power conversion device according to claim 13, wherein the heat radiation plate has a band engaging groove for allowing the fixing band to be engaged therewith, or a band inserting hole for allowing the fixing band to be inserted therethrough.

16. The power conversion device according to claim 10, further comprising a second heat-conducting material, which is provided in at least a part of the recessed portion of the casing, and is formed of a resin.

17. The power conversion device according to claim 10, further comprising a fourth heat-conducting material, which is provided between the magnetic component and the heat radiation plate, and is formed of a resin.

18. The power conversion device according to claim 10, further comprising a fifth heat-conducting material, which is provided between the magnetic component and the casing, and is formed of a resin.

19. A power conversion device, comprising:
a casing having a recessed portion;
a magnetic component accommodated in the recessed portion of the casing;
a heat radiation plate, which covers an opening of the recessed portion of the casing, and is thermally coupled to the magnetic component; and
a fixing band wound around the magnetic component and the heat radiation plate to fix the magnetic component to the heat radiation plate,
wherein the magnetic component includes:
an upper core thermally coupled to the heat radiation plate;
a lower core, which is provided so as to be opposed to the upper core, and is thermally coupled to the casing; and
a winding portion provided between the upper core and the lower core,
wherein the heat radiation plate has a band engaging groove for allowing the fixing band to be engaged therewith, or a band inserting hole for allowing the fixing band to be inserted therethrough.

20. A power conversion device, comprising:
a casing having a recessed portion;
a magnetic component accommodated in the recessed portion of the casing;
a heat radiation plate, which covers an opening of the recessed portion of the casing, and is thermally coupled to the magnetic component; and
a fixing band wound around the magnetic component and the heat radiation plate to fix the magnetic component to the heat radiation plate,
wherein at least a part of the fixing band is accommodated in a band accommodating groove formed in the recessed portion of the casing,
wherein the magnetic component includes:
an upper core thermally coupled to the heat radiation plate;
a lower core, which is provided so as to be opposed to the upper core, and is thermally coupled to the casing; and
a winding portion provided between the upper core and the lower core,
wherein the heat radiation plate has a band engaging groove for allowing the fixing band to be engaged therewith, or a band inserting hole for allowing the fixing band to be inserted therethrough.

* * * * *